United States Patent
Hung et al.

(10) Patent No.: US 11,302,635 B2
(45) Date of Patent: Apr. 12, 2022

(54) ELECTRONIC APPARATUS AND MANUFACTURING METHOD THEREOF

(71) Applicant: Innolux Corporation, Miao-Li County (TW)

(72) Inventors: Tang Chin Hung, Miao-Li County (TW); Chin-Lung Ting, Miao-Li County (TW); Chung-Kuang Wei, Miao-Li County (TW); Ker-Yih Kao, Miao-Li County (TW); Tong-Jung Wang, Miao-Li County (TW); Chih-Yung Hsieh, Miao-Li County (TW); Hao Jung Huang, Miao-Li County (TW); I-Yin Li, Miao-Li County (TW); Chia-Chi Ho, Miao-Li County (TW); Yi Hung Lin, Miao-Li County (TW); Cheng-Hsu Chou, Miao-Li County (TW); Chia-Ping Tseng, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 20 days.

(21) Appl. No.: 16/920,448

(22) Filed: Jul. 3, 2020

(65) Prior Publication Data
US 2021/0035909 A1 Feb. 4, 2021

Related U.S. Application Data

(60) Provisional application No. 62/985,892, filed on Mar. 6, 2020, provisional application No. 62/879,568, filed on Jul. 29, 2019.

(30) Foreign Application Priority Data

May 15, 2020 (CN) .......................... 202010411348.5

(51) Int. Cl.
*H01L 23/528* (2006.01)
*H01L 27/06* (2006.01)
(Continued)

(52) U.S. Cl.
CPC .. *H01L 23/5283* (2013.01); *H01L 21/823475* (2013.01); *H01L 23/5223* (2013.01);
(Continued)

(58) Field of Classification Search
CPC ......... H01L 21/823475; H01L 23/5223; H01L 27/0629; H01L 27/0649; H01L 29/93; H01L 2021/6006
See application file for complete search history.

(56) References Cited

U.S. PATENT DOCUMENTS 9,640,531 B1 * 5/2017 Or-Bach ........... H01L 21/76816
2010/0079387 A1 4/2010 Rosenblatt et al.
(Continued)

FOREIGN PATENT DOCUMENTS

CN 102916067 2/2013
CN 106575823 4/2017

*Primary Examiner* — Joseph C. Nicely
(74) *Attorney, Agent, or Firm* — JCIPRNET

(57) ABSTRACT

The disclosure provides an electronic apparatus and a manufacturing method thereof. The electronic apparatus includes a first insulating layer, a first metal layer, a second metal layer, and an electronic assembly. The first insulating layer includes a first surface and a second surface opposite to the first surface. The first metal layer has an opening and is formed on the first surface. The second metal layer is formed on the second surface and a projection of the opening on the second surface is overlapped with a projection of the second metal layer on the second surface. The electronic assembly is electrically connected with the first metal layer and the second metal layer.

6 Claims, 20 Drawing Sheets

(51) Int. Cl.
  *H01L 23/522*   (2006.01)
  *H01L 21/8234*  (2006.01)
  *H01L 29/93*    (2006.01)
  *H01L 23/538*   (2006.01)
  *H01L 21/60*    (2006.01)

(52) U.S. Cl.
  CPC ...... *H01L 23/5226* (2013.01); *H01L 27/0629* (2013.01); *H01L 29/93* (2013.01); *H01L 23/5385* (2013.01); *H01L 27/0694* (2013.01); *H01L 2021/6006* (2013.01)

(56) References Cited

U.S. PATENT DOCUMENTS

| | | |
|---|---|---|
| 2011/0043328 A1 | 2/2011 | Bassali |
| 2011/0290296 A1 | 12/2011 | Daniel et al. |
| 2015/0001519 A1 | 1/2015 | Matsuura et al. |
| 2015/0370521 A1 | 12/2015 | Yang et al. |
| 2017/0301475 A1 | 10/2017 | Stevenson et al. |
| 2018/0159245 A1 | 6/2018 | Chen et al. |
| 2018/0374845 A1* | 12/2018 | Colinge ................ H01L 29/775 |

* cited by examiner

ELECTRONIC APPARATUS AND MANUFACTURING METHOD THEREOF

CROSS-REFERENCE TO RELATED APPLICATION

This application claims the priority benefit of U.S. provisional application Ser. No. 62/879,568, filed on Jul. 29, 2019, U.S. provisional application Ser. No. 62/985,892, filed on Mar. 6, 2020, and China application serial no. 202010411348.5, filed on May 15, 2020. The entirety of each of the above-mentioned patent applications is hereby incorporated by reference herein and made a part of this specification.

BACKGROUND

Technical Field

The disclosure relates to an apparatus, and particularly relates to an electronic apparatus and a manufacturing method thereof.

Description of Related Art

The increasing delicacy of electronic apparatuses makes it more and more difficult to directly manufacture an active assembly on a substrate, a thin film, or glass. Besides, due to the line width and pitch limitations in semiconductor manufacturing processes, a multi-layered routing structure needs to be manufactured on a conventional circuit substrate, so as to dispose an active assembly on the circuit substrate. Accordingly, the size and the manufacturing cost of an electronic apparatus are increased. In view of this, several embodiments are proposed in the following.

SUMMARY

The embodiments of the disclosure relate to an electronic apparatus and a manufacturing method of the electronic apparatus, and are capable of providing or manufacturing an electronic apparatus with an electronic structure including a transistor circuit and single-sided or double-sided redistribution layer (RDL) routing.

According to an embodiment of the disclosure, an electronic apparatus includes a first insulating layer, a first metal layer, a second metal layer, and an electronic assembly. The first insulating layer includes a first surface and a second surface opposite to the first surface. The first metal layer has an opening and is formed on the first surface. The second metal layer is formed on the second surface and a projection of the opening on the second surface is overlapped with a projection of the second metal layer on the second surface. The electronic assembly is electrically connected with the first metal layer and the second metal layer.

According to an embodiment of the disclosure, an electronic apparatus includes a first insulating layer, a first metal layer, a second metal layer, a PN junction assembly, and a transistor circuit. The first insulating layer includes a first surface and a second surface opposite to the first surface. The first metal layer is formed above the second surface. The second metal layer is formed on the second surface. The PN junction assembly is disposed on the first surface and electrically connected with the first metal layer and the second metal layer. The PN junction assembly includes a variable capacitor. The transistor circuit is electrically connecting with the second metal layer.

According to an embodiment of the disclosure, a manufacturing method of an electronic apparatus includes: providing a carrier substrate; forming a first metal layer having an opening on the carrier substrate; forming a first insulating layer on the first metal layer, and a first surface of the first insulating layer contacts the first metal layer; and forming a second metal layer on the first insulating layer, and a second surface of the first insulating layer contacts the second metal layer, wherein the first surface is opposite to the second surface, and a projection of the opening on the second surface is overlapped with a projection of the second metal layer on the second surface.

According to an embodiment of the disclosure, a manufacturing method of an electronic apparatus includes: providing a carrier substrate; forming a first insulating layer on the carrier substrate, and a first surface of the first insulating layer contacts the carrier substrate; forming a first metal layer and a second metal layer on the first insulating layer, and a second surface of the first insulating layer contacts the first metal layer and the second metal layer, wherein the first surface is opposite to the second surface; electrically connecting the transistor circuit with the second metal layer; removing the carrier substrate; and disposing a PN junction assembly having a variable capacitor on the first insulating layer, and electrically connecting the PN junction assembly with the first metal layer and the second metal layer.

Based on the above, the electronic apparatus and the manufacturing method of the electronic apparatus according to the embodiments of the disclosure are able to realize an electronic apparatus with an electronic structure that is smaller and requires a lost manufacturing cost by using RDL routing with a fewer number of layers and disposing a transistor circuit.

To make the features and advantages of the disclosure more comprehensible, a detailed description is made below with reference to the accompanying drawings by using embodiments.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
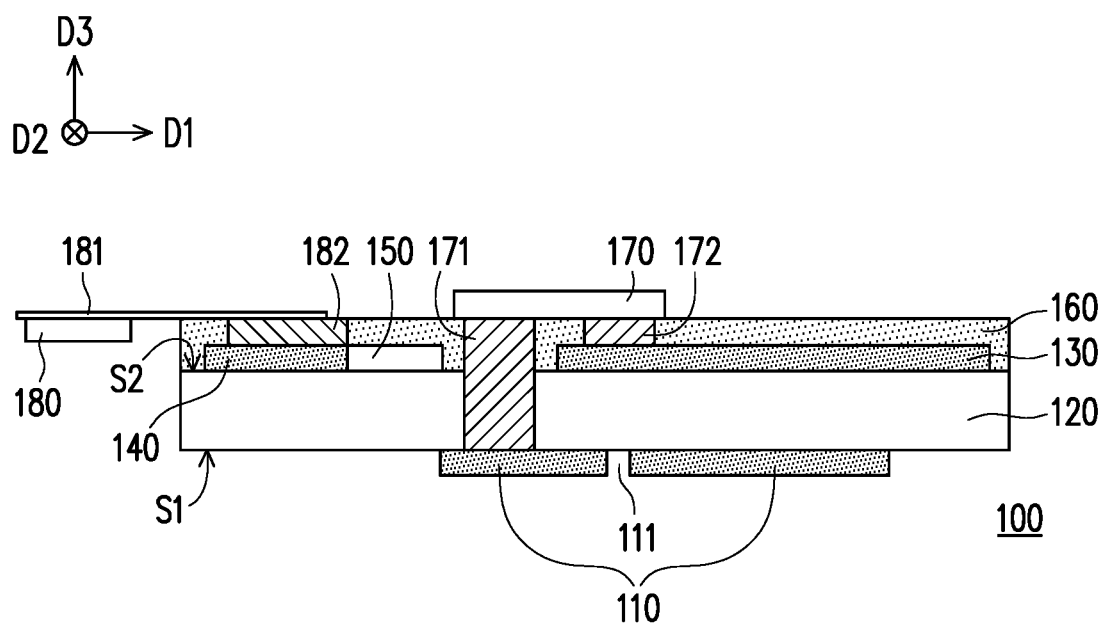
FIG. 1 is a schematic cross-sectional view illustrating a structure of an electronic apparatus according to a first embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

Some words are used to refer to specific elements in the whole specification and the appended claims in the disclosure. A person skilled in the art should understand that a display facility manufacturer may use different names to refer to the same elements. The specification is not intended to distinguish elements that have the same functions but different names. In the specification and the claims, words such as "include", "comprise", and "have" are open words, and should be interpreted as "including, but not limited to".

In some embodiments of the disclosure, unless otherwise specified, terms for bonding or connection, such as "connect", "interconnect", etc., may indicate that two structures are in direct contact with each other, or that the two structures are not in direct contact with each other and another structure is provided between the two structures. The terms for bonding or connection also cover the case where the two structures are both movable or the two structures are both fixed. In addition, the term "couple" refers to any direct or indirect electrical connection means.

The description that a first material layer is disposed on or above a second material layer covers the case where the first material layer is in direct contact with the second material layer. Alternatively, such description also covers the case where one or more material layers intervene between the first material layer and the second material layer. In such case, it is possible that the first material layer and the second material layer are not in direct contact with each other. In some embodiments of the disclosure, unless otherwise specified, terms for bonding or connection, such as "connect", "interconnect", etc., may indicate that two structures are in direct contact with each other, or that the two structures are not in direct contact with each other and another structure is provided between the two structures. The terms for bonding or connection also cover the case where the two structures are both movable or the two structures are both fixed.

In addition, the terms such as "about", "approximately", "substantially", etc., are generally interpreted as within 15% of the given value or range, or interpreted as within 10%, 5%, 3%, 2%, 1%, or 0.5% of the given value or range. Here, a given number is interpreted as an approximate number. In other words, even without "about", "approximately", "substantially", etc., the number still bears the meaning of "about", "approximately", "substantially", etc.

While terms such as "first", "second", "third", etc. may serve to describe or name different components, these components shall not be limited by these terms. These terms merely serve to distinguish one component in the specification from other components and are irrelevant of the order in which the components are manufactured. Different terms may be used in the claims, and the terms may be named with terms such as "first", "second", "third", etc., according to the order in which the terms are stated in the claims. Accordingly, a first component in the specification may be a second component in the claims. In the disclosure, unless otherwise described, the components with the same name (e.g., transistor circuit 150, transistor circuit 350, etc.) in different embodiments or drawings may bear like or similar properties and, for the conciseness of description, the descriptions thereof will not be made repetitively.

It should be noted that in the following embodiments, features in a plurality of embodiments may be replaced, recombined, or mixed to complete other embodiments without departing from the spirit of the disclosure.

FIG. 1 is a schematic cross-sectional view illustrating a structure of an electronic apparatus according to a first embodiment of the disclosure. Referring to FIG. 1, an electronic apparatus 100 may include an electronic structure having double-sided redistribution layer (RDL) routing, so that a relevant electronic element or circuit element may be disposed on both sides of a substrate. However, the disclosure is not limited thereto. Specifically, the electronic apparatus 100 may include a first metal layer 110, a first insulating layer 120, a second metal layer 130, a routing layer 140, a transistor circuit 150, a second insulating layer 160, an electronic assembly 170, and a control circuit 180. The transistor circuit 150 may include one or more transistors, such as a thin-film transistor (TFT), and the transistors may be bottom-gate transistors, top-gate transistors, or double/dual-gate transistors. The transistor circuit 150 may be electrically connected with the first metal layer 110 and/or the electronic assembly 170. However, the disclosure is not limited thereto. In the embodiment, the first insulating layer 120 includes a first surface S1 and a second surface S2. The first surface S1 is opposite to the second surface S2. Each of the first surface S1 and the second surface S2 is substantially parallel to a plane formed by extending from a first direction D1 and a second direction D2. The first surface S1 faces toward a direction opposite to a third direction D3, and the second surface S2 faces toward the third direction D3. The first direction D1, the second direction D2, and the third direction D3 are substantially perpendicular to each other. In the embodiment, the first insulating layer 120 may include a flexible material, such as polyimide (PI). However, the disclosure is not limited thereto. In some embodiments, the first insulating layer 120 may also include a rigid material (e.g., glass, ceramics, sapphire, or other suitable materials), a flexible material (e.g., a polymer material or other suitable materials), or a plastic circuit board, etc.

In the embodiment, the first metal layer 110 has an opening 111 and is formed on a first surface S1 of the first insulating layer 120. The opening 111 may extend in the second direction D2 and exhibit a trough structure. The second metal layer 130 is formed on the second surface S2 of the first insulating layer 120. In the embodiment, a projection of the opening 111 on the second surface S2 in the third direction D3 is overlapped with a projection of the second metal layer 130 on the second surface S2 in the direction opposite to the third direction D3. It should be noted that the first metal layer 110 may include a circuit assembly or a metal assembly structure including at least one of an electrode sheet, a bonding pad, a routing, and a heat sink, and the second metal layer 130 may also include a circuit assembly or a metal assembly structure including at least one of an electrode sheet, a bonding pad, a routing, and a heat sink. In the embodiment, the routing layer 140 and the transistor circuit 150 may also be formed on the second surface S2 of the first insulating layer 120. In addition, the routing layer 140 may include a plurality of circuit wires. The transistor circuit 150 is electrically connected with the routing layer 140. In some embodiments, the second metal layer 130, the routing layer 140, and the transistor circuit 150 may be formed at the same layer on the second surface S2 of the first insulating layer 120, or may be formed between a plurality of other insulating layers on the second surface S2 of the first insulating layer 120, so as to respectively keep different distances from the second surface S2 of the first insulating layer 120.

In the embodiment, the second insulating layer 160 covering the second metal layer 130, the routing layer 140, and the transistor circuit 150 is further formed on the second surface S2 of the first insulating layer 120. The electronic assembly 170 may be disposed on the second insulating layer 160. The electronic assembly 170 may be electrically connected with the first metal layer 110 and the second metal layer 130 via a conductor 171 and a conductor 172. However, the disclosure is not limited thereto. The conductor 171 may be arranged as a via to penetrate through the first insulating layer 120 and the second insulating layer 160. In addition, the conductor 172 may be arranged as a via to penetrate through the second insulating layer 160. The materials of the conductors 171 and 172 may include a metal conductive material, such as a tin lead alloy. In the embodiment, the electronic assembly 170 may include a PN unction assembly, a solar cell, an integrated circuit (IC), a light emitting diode (LED) assembly, or a sensor, etc. However, the disclosure is not limited thereto. In some embodiments, the PN junction assembly includes a variable capacitor, such as a varactor. However, the disclosure is not limited thereto. In addition, in some embodiments, a passive assembly, a thin film battery, a sensor, or an LED, etc., may also be disposed on or electrically connected with the first metal layer 110 on the first surface S1 of the first insulating layer 120. However, the disclosure is not limited thereto, either. In the embodiment, the control circuit 180 may be disposed on a carrier plate 181 and electrically connected with the routing layer 140 through a conductive material 182, so as to be electrically connected with the transistor circuit 150 via the routing layer 140. However, the disclosure is not limited thereto. The conductive material 182 may include an anisotropic conductive film or other suitable conductive materials. However, the disclosure is not limited thereto. In the embodiment, the control circuit 180 is configured to provide relevant electronic signals, such as control signals, driving signals, etc., to the electronic assembly 170 via the transistor circuit 150 to control or drive the electronic assembly 170.

Therefore, the electronic apparatus 100 of the embodiment is provided with an architecture having the double-sided RDL routing and provided with the transistor circuit 150. In addition, the electronic assembly 170 disposed on the substrate may be controlled or driven by the transistor circuit 150. In an embodiment, the carrier plate 181 may include a flexible printed circuit (FPC) board or other suitable circuit boards. However, the disclosure is not limited thereto. In other embodiments, the control circuit 180 may be electrically connected with the transistor circuit 150, but the electrical connection does not need to go through the carrier plate 181 and/or the conductive material 182.

In the embodiment, the electronic apparatus 100 may include a display apparatus, an electromagnetic wave adjustment apparatus, a sensing apparatus, or a splicing apparatus. However, the disclosure is not limited thereto. The electronic apparatus 100 may be a bendable or flexible electronic apparatus. The electronic apparatus 100 may include, for example, a liquid crystal light emitting diode, and the light emitting diode may include, for example, an inorganic light emitting diode, an organic light emitting diode (OLED), a mini LED, a micro LED, a quantum dot LED (such as QLED or QDLED), fluorescence, phosphor, or other suitable materials, and the materials may be arbitrarily combined/arranged. However, the disclosure is not limited thereto. The electromagnetic wave adjustment apparatus may serve to receive or transmit electromagnetic waves, for example. However, the disclosure is not limited thereto. The splicing apparatus may be, for example, a display splicing apparatus or a splicing apparatus for the electromagnetic wave adjustment apparatus. However, the disclosure is not limited thereto. The electronic apparatus 100 may be an arbitrary combination of the aforementioned components. However, the disclosure is not limited thereto.

Figure 2A:
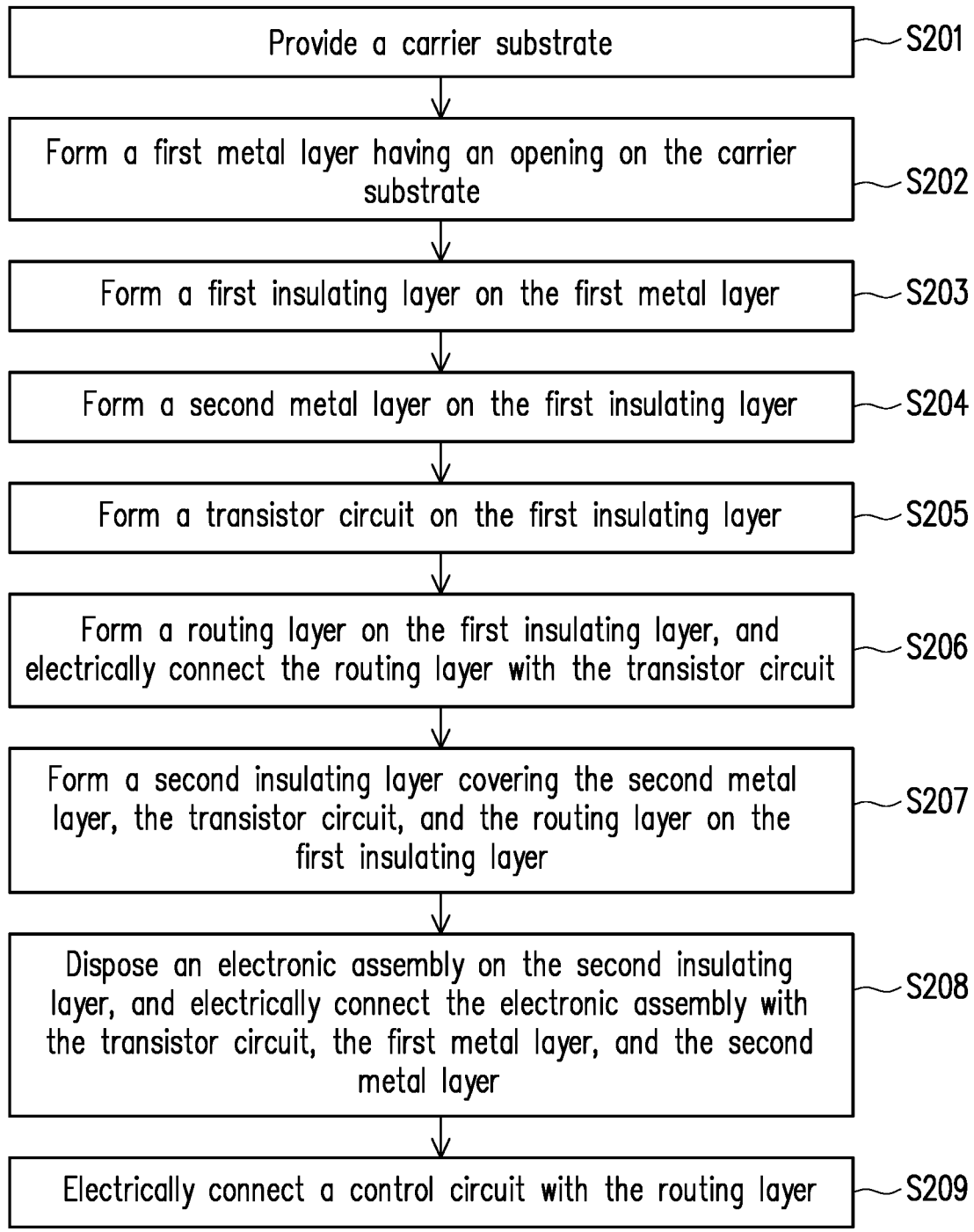
FIGS. 2A and 2B are flowcharts illustrating a manufacturing method of the electronic apparatus according to the first embodiment of the disclosure.
Figure 2B:
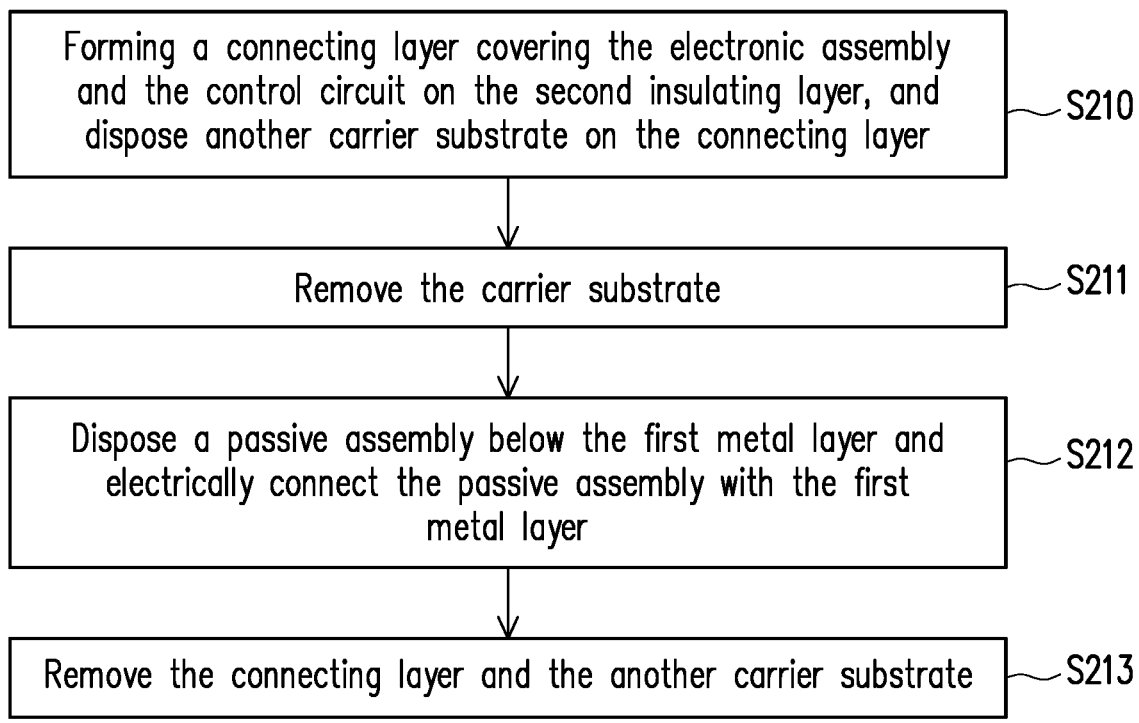
Figure 3A:
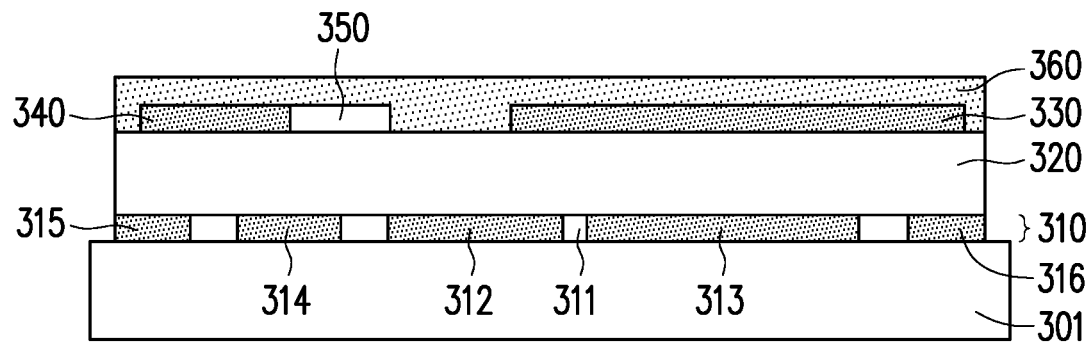
FIGS. 3A to 3D are schematic cross-sectional views illustrating structures in respective stages in the manufacturing method shown in FIGS. 2A and 2B.

FIGS. 2A and 2B are flowcharts illustrating a manufacturing method of the electronic apparatus according to the first embodiment of the disclosure. FIGS. 3A to 3D are schematic cross-sectional views illustrating structures in respective stages in the manufacturing method shown in FIGS. 2A and 2B. Each of the steps in the embodiment may be carried out by performing a corresponding semiconductor manufacturing process or a combination of a plurality of corresponding semiconductor manufacturing processes. In addition, the structures of FIGS. 3A to 3D formed in the respective intermediate steps may be respectively implemented independently as specific electronic apparatuses, and these structures are not limited to being only applicable to the electronic apparatus manufactured in the final step. Referring to FIGS. 2A and 3A, the manufacturing method of FIG. 2A allows to manufacture an electronic apparatus with an electronic structure having double-sided RDL routing. In Step S201, a carrier substrate 301 is provided. The carrier substrate 301 may be a rigid substrate or a flexible substrate. The disclosure does not intend to impose a limitation on this regard. In Step S202, a first metal layer 310 having an opening 311 is formed on the carrier substrate 301. The opening 311 may be formed by performing a semiconductor etching process. Also, in the first metal layer 310, a metal component or a circuit component such as an electrode 312, an electrode 313, an electrode 314, an electrode 315, and an electrode 316, etc., shown in FIG. 3A may be formed by performing a semiconductor etching process. In the embodiment, one or more of the electrodes 312, 313, 314, 315, and 316 may be omitted. However, the disclosure is not limited thereto. In Step S203, a first insulating layer 320 may be formed on the first metal layer 310, and the first surface S1 of the first insulating layer 320 contacts the first metal layer 310. In Step S204, a second metal layer 330 is formed on the first insulating layer 320, and the second surface S2 of the first insulating layer 320 contacts the second metal layer 330. The first surface S1 is opposite to the second surface S2. It should be noted that a projection of the opening 311 on the second surface S2 may be overlapped with a projection of the second metal layer 330 on the second surface S2. In the disclosure, unless otherwise specified, the term "overlapping" may refer to both completely overlapping and partially overlapping. In Step S205, a transistor circuit 350 may be formed on the first insulating layer 320. In Step S206, a routing layer 340 may be formed on the first insulating layer 320. In addition, the routing layer 340 may be electrically connected with the transistor circuit 350. In Step S207, a second insulating layer 360 covering the second metal layer 330, the routing layer 340, and the transistor circuit 350 is formed on the first insulating layer 320.

Figure 3B:
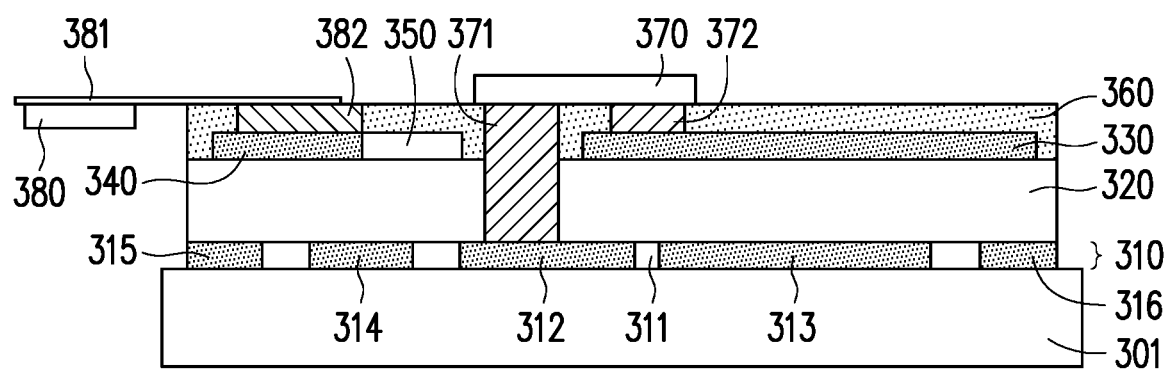

Referring to FIGS. 2A and 3B, in Step S208, an electronic assembly 370 is disposed on the second insulating layer 360, and the electronic assembly 370 is electrically connected with the transistor circuit 350, the first metal layer 310, and the second metal layer 330. The electronic assembly 370 may be electrically connected with the first metal layer 310 and the second metal layer 330 through a conductor 371 and a conductor 372 by performing a surface mount technology (SMT) process, and may be electrically connected with the transistor circuit 350 via additional routing. The conductor 371 may be arranged as a via to penetrate through the first insulating layer 320 and the second insulating layer 360. The conductor 372 may also be arranged as a via to penetrate through the second insulating layer 360. In Step S209, a control circuit 380 is electrically connected with the routing layer 340. The chip on film (COF) packaging technology or the chip on glass (COG) technology may be adopted to manufacture the control circuit 380 on a carrier plate 381. The carrier plate 381 may be a thin film or glass. The routing layer 340 may include a fan-out routing, and the routing layer 340 may be arranged in correspondence with the via or opening of the second insulating layer 360 above the routing layer 340. However, the disclosure is not limited thereto. In the embodiment, a control chip formed by the control circuit 380 and the carrier plate 381 may be arranged above the routing layer 340 in a chip face down manner, and the control chip may be electrically connected with the routing layer 340 by SMT or by bonding with an anisotropic conductive film (ACF). However, the disclosure is not limited thereto. For example, the control circuit 380 may be electrically connected with the routing layer 340 through a circuit on the carrier plate 381 and a conductive material 382 and electrically connected with the transistor circuit 350 via the routing layer 340. The control circuit 380 may control or drive the electronic assembly 370 through the transistor circuit 350.

For example, the electronic assembly 370 may include a variable capacitor. In addition, the control circuit 380 may modulate the capacitance value of the variable capacitor through the transistor circuit 350, so that the capacitance value between the first metal layer 310 and the second metal layer 330 may be correspondingly adjusted. Therefore, an electromagnetic wave radiation assembly or an electromagnetic wave radiation modulator may be formed between the opening 311 of the first metal layer 310 and the second metal layer 330. However, the disclosure is not limited thereto.

Figure 3C:
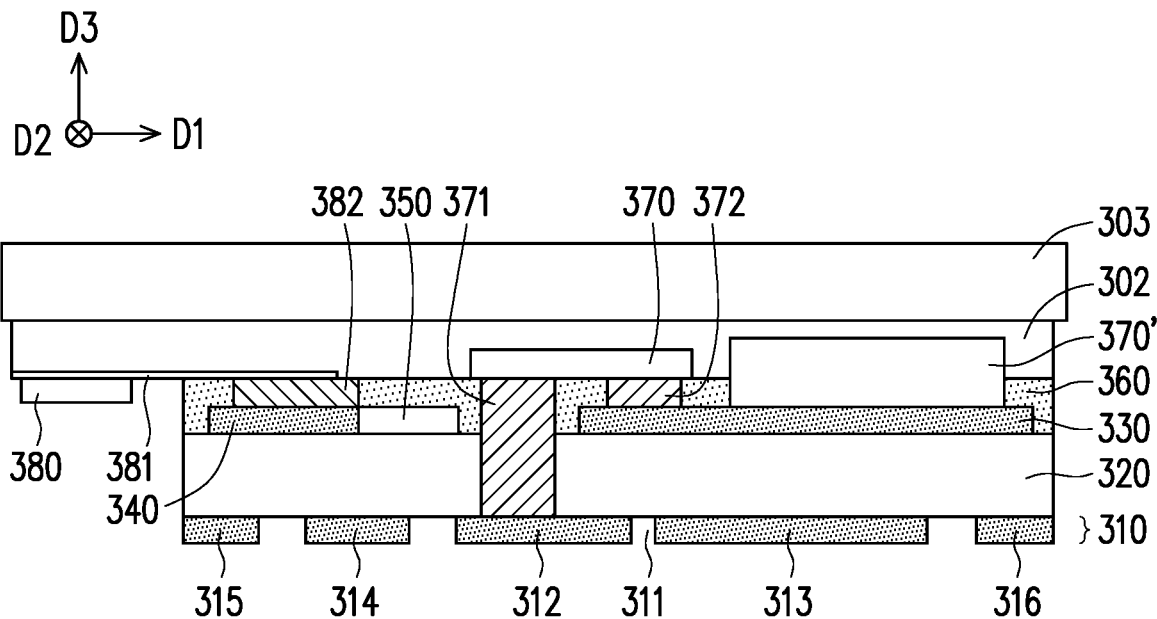
Figure 3D:
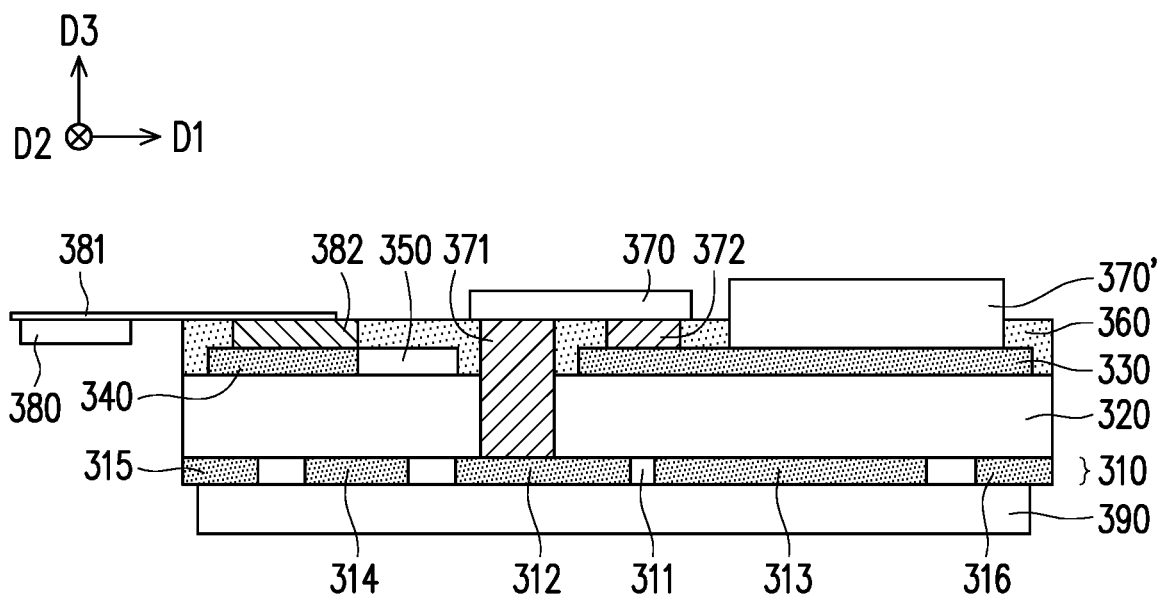

Referring to FIG. 3C, in some embodiments, Step S208 may further include further providing another electronic assembly 370' on the second insulating layer 360. In addition, the electronic assembly 370' may be electrically connected with the second metal layer 330. Referring to FIGS. 2B and 3C, in Step S210, a connecting layer 302 covering the electronic assemblies 370 and 370' and the control circuit 380 is formed on the second insulating layer 360, and another carrier substrate 303 is disposed on the connecting layer 302. The carrier substrate 303 may be a rigid substrate or a flexible substrate, and the material of the connecting layer 302 may include a temporary connecting material, for example. In Step S211, the carrier substrate 301 is removed. The carrier substrate 301 may be removed by, for example, laser, heating, or light irradiation, etc. The disclosure does not intend to impose a limitation on this regard. Since the material of the first insulating layer 320 may include a flexible circuit board material, for example, in order to reduce the damages to the structures and the assembly on the sides of the first insulating layer 320 when the carrier substrate 301 is removed, the another carrier substrate 303 and the connecting layer 302 are firstly formed on the second insulating layer 360, and then the carrier substrate 301 is removed. Referring to FIGS. 2B and 3D, in Step S212, a passive assembly 390 may be disposed below the first metal layer 310, and the passive assembly 390 is electrically connected with the first metal layer 310. In Step S213, the connecting layer 302 and the carrier substrate 303 are removed. The connecting layer 302 may be removed by, for example, laser, heating, or light irradiation, etc., so that the carrier substrate 303 may be separated from the second insulating layer 360. However, the disclosure is not limited thereto. In addition, Steps S210 to S213 of FIG. 2B may also be applied to the structure shown in FIG. 3B, so as to effectively remove the carrier substrate 301 of FIG. 3B.

For example, the electronic assembly 370 may include an integrated circuit, and the another electronic assembly 370' may include a solar cell. The integrated circuit may, for example, include a relevant modulation circuit, such as a rectifier. The passive assembly 390 may be a thin film battery. Therefore, the solar cell may provide electric power to the integrated circuit via the first metal layer 310. In addition, after voltage or current modulation, the modulated electric power is supplied to the second metal layer 330, so as to charge the thin film battery. However, the disclosure is not limited thereto.

Figure 4:
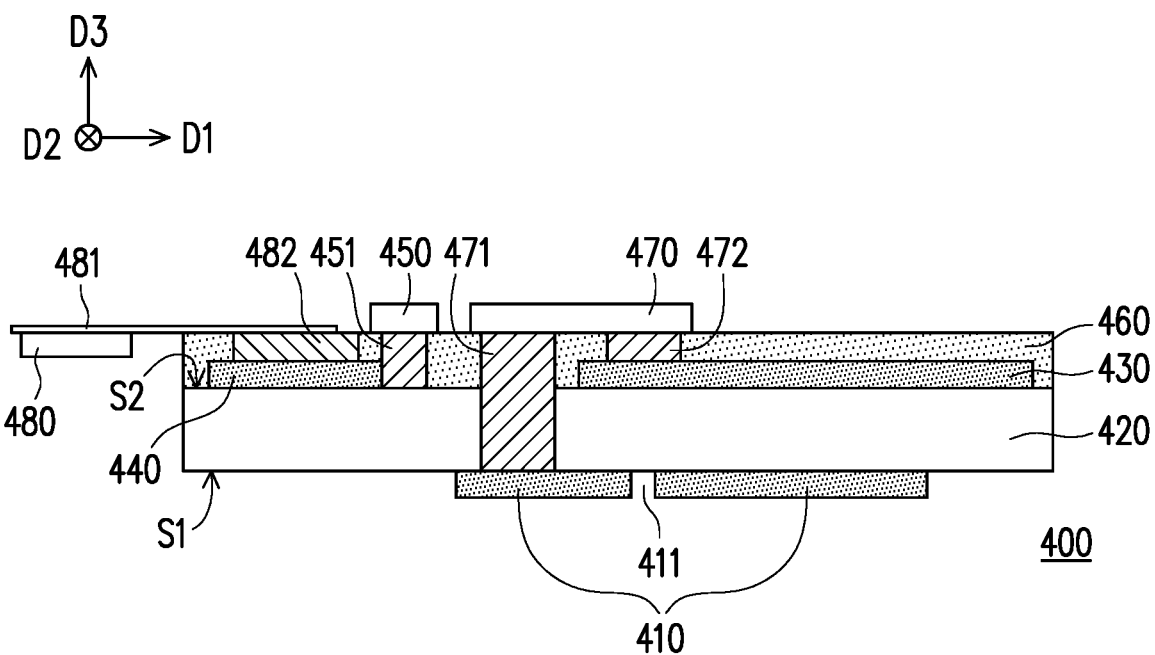
FIG. 4 is a schematic cross-sectional view illustrating a structure of an electronic apparatus according to a second embodiment of the disclosure.

FIG. 4 is a schematic cross-sectional view illustrating a structure of an electronic apparatus according to a second embodiment of the disclosure. FIG. 4 is a schematic cross-sectional view illustrating a structure of an electronic apparatus according to a second embodiment of the disclosure. An electronic apparatus 400 may include an electronic structure having double-sided redistribution layer (RDL) routing, so that a relevant electronic element or circuit element may be disposed on both sides of a substrate. Specifically, the electronic apparatus 400 includes a first metal layer 410, a first insulating layer 420, a second metal layer 430, a routing layer 440, a transistor circuit 450, a second insulating layer 460, an electronic assembly 470, and a control circuit 480. The transistor circuit 450 may include one or more transistors, and the transistors may be bottom-gate transistors, top-gate transistors, or double/dual-gate transistors. In the embodiment, the first insulating layer 420 includes the first surface S1 and the second surface S2. The first surface S1 is opposite to the second surface S2. In the embodiment, the first insulating layer 420 may include a flexible circuit board material. However, the disclosure is not limited thereto. In some embodiments, the material of the first insulating layer 420 may also include a rigid material, a flexible circuit, or a plastic circuit board, etc.

However, the disclosure is not limited thereto. It should be noted that the transistor circuit 450 of the embodiment may be a die having a plurality of transistor circuits to electrically connect the transistor circuits 450 integrated on the die and the routing layer 440, thereby electrically connecting the transistor circuit 450 and the routing layer 440. For example, the transistor circuit 450 may include a base material (not shown) and at least one transistor. The material of the base material may include glass or other suitable materials. The at least one transistor is disposed on the base material, and the transistor circuit 450 is electrically connected with the routing layer 440.

In the embodiment, the first metal layer 410 may have an opening 411 and may be formed on the first surface S1 of the first insulating layer 420. For example, the opening 411 may extend in the second direction D2, and may include a trough structure. However, the disclosure is not limited thereto. The second metal layer 430 may be formed on the second surface S2 of the first insulating layer 420. In the embodiment, a projection of the opening 411 on the second surface S2 in the third direction D3 may be overlapped with a projection of the second metal layer 430 on the second surface S2 in the direction opposite to the third direction D3. It should be noted that the first metal layer 410 may include a circuit assembly or a metal assembly structure including at least one of an electrode sheet, a bonding pad, a routing, and a heat sink, and the second metal layer 430 may also include a circuit assembly or a metal assembly structure including at least one of an electrode sheet, a bonding pad, a routing, and a heat sink. However, the disclosure is not limited thereto. In the embodiment, the routing layer 440 may also be formed on the second surface S2 of the first insulating layer 420. In addition, the routing layer 440 may include a plurality of circuit wires. In some embodiments, the second metal layer 430 and the routing layer 440 may be formed at the same layer on the second surface S2 of the first insulating layer 420. In other embodiments, the second metal layer 430 and/or the routing layer 440 may respectively keep different distances from the second surface S2 of the first insulating layer 420. In addition, at least one insulating layer may be disposed between the second metal layer 430 and the routing layer 440. However, the disclosure is not limited thereto.

In the embodiment, the second insulating layer 460 covering the second metal layer 430 and the routing layer 440 is further formed on the second surface S2 of the first insulating layer 420. The transistor circuit 450 and the electronic assembly 470 are disposed on the second insulating layer 460. The transistor circuit 450 may be electrically connected with the routing layer 440 via a conductor 451. The electronic assembly 470 may be electrically connected with the first metal layer 410 and the second metal layer 430 via a conductor 471 and a conductor 472. The conductors 451 and 471 may be arranged as vias to penetrate through at least a portion of the first insulating layer 420 and/or at least a portion of the second insulating layer 460. In addition, the conductor 472 may be arranged as a via to penetrate through the second insulating layer 460. The materials of the conductors 451, 471 and 472 may include a metal conductive material, such as a tin lead alloy. In the embodiment, the electronic assembly 470 may include a PN unction assembly, a solar cell, an integrated circuit (IC), a light emitting diode (LED) assembly, a sensor, etc., other suitable electronic assemblies, or a combination thereof. However, the disclosure is not limited thereto. In some embodiments, the PN junction assembly includes a variable capacitor. In addition, in some embodiments, a passive assembly, a thin film battery, a sensor, or an LED, etc., may also be disposed on or electrically connected with the first metal layer 410 on the first surface S1 of the first insulating layer 420. However, the disclosure is not limited thereto, either. In the embodiment, the control circuit 480 may be disposed on a carrier plate 481 and electrically connected with the routing layer 440 through a conductive material 482, so as to be electrically connected with the transistor circuit 450 via the routing layer 440. In the embodiment, the control circuit 480 is configured to provide relevant electronic signals, such as control signals, driving signals, etc., to the electronic assembly 470 via the transistor circuit 450 to control or drive the electronic assembly 470. The transistor circuit 450 may be electrically connected with the first metal layer 410 and the electronic assembly 470. However, the disclosure is not limited thereto. Therefore, the electronic apparatus 400 of the embodiment is provided with an architecture having the double-sided RDL routing and provided with the transistor circuit 450. In addition, the electronic assembly 470 disposed on the substrate may be controlled or driven by the transistor circuit 450.

Figure 5A:
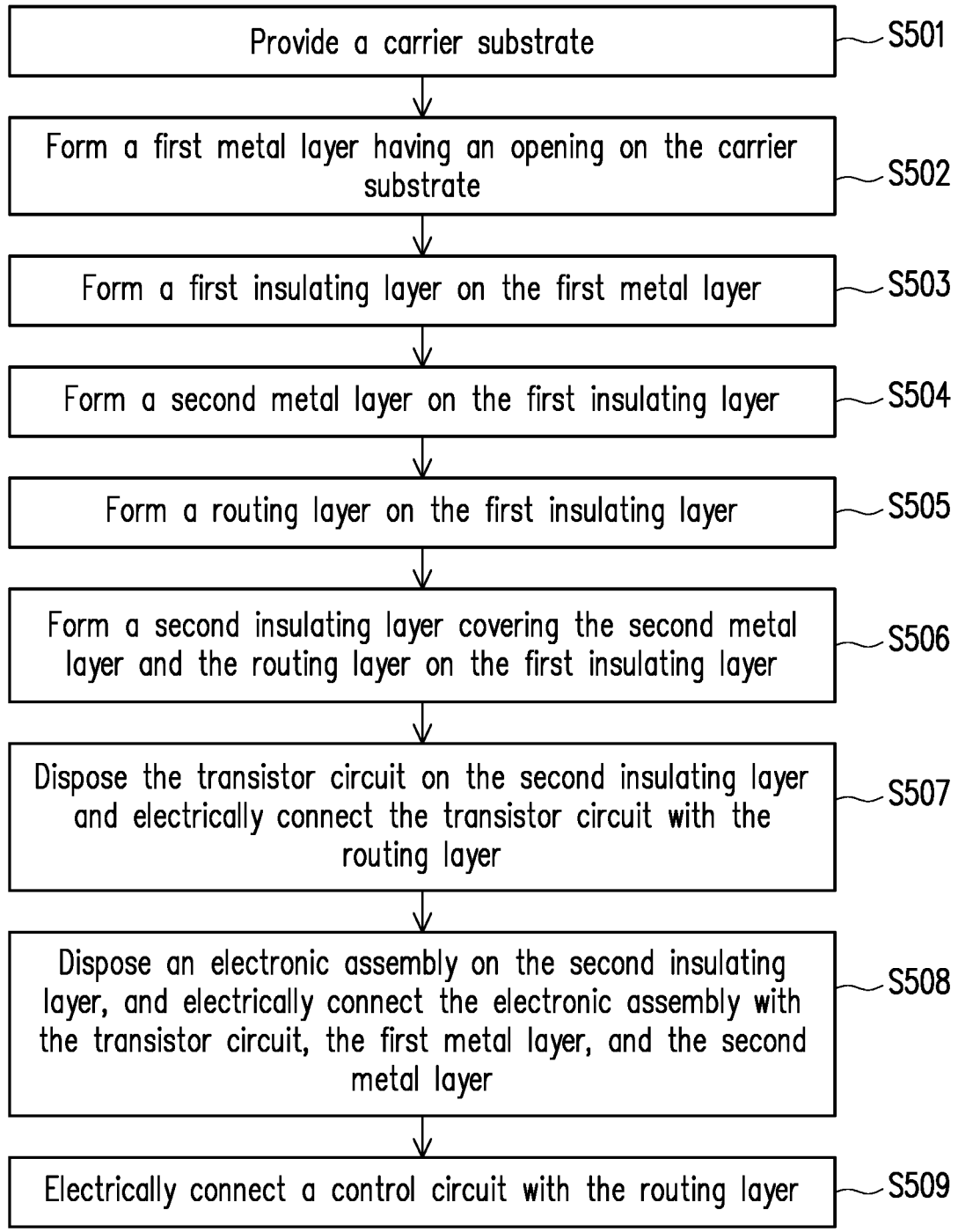
FIGS. 5A and 5B are flowcharts illustrating a manufacturing method of the electronic apparatus according to the second embodiment of the disclosure.
Figure 5B:
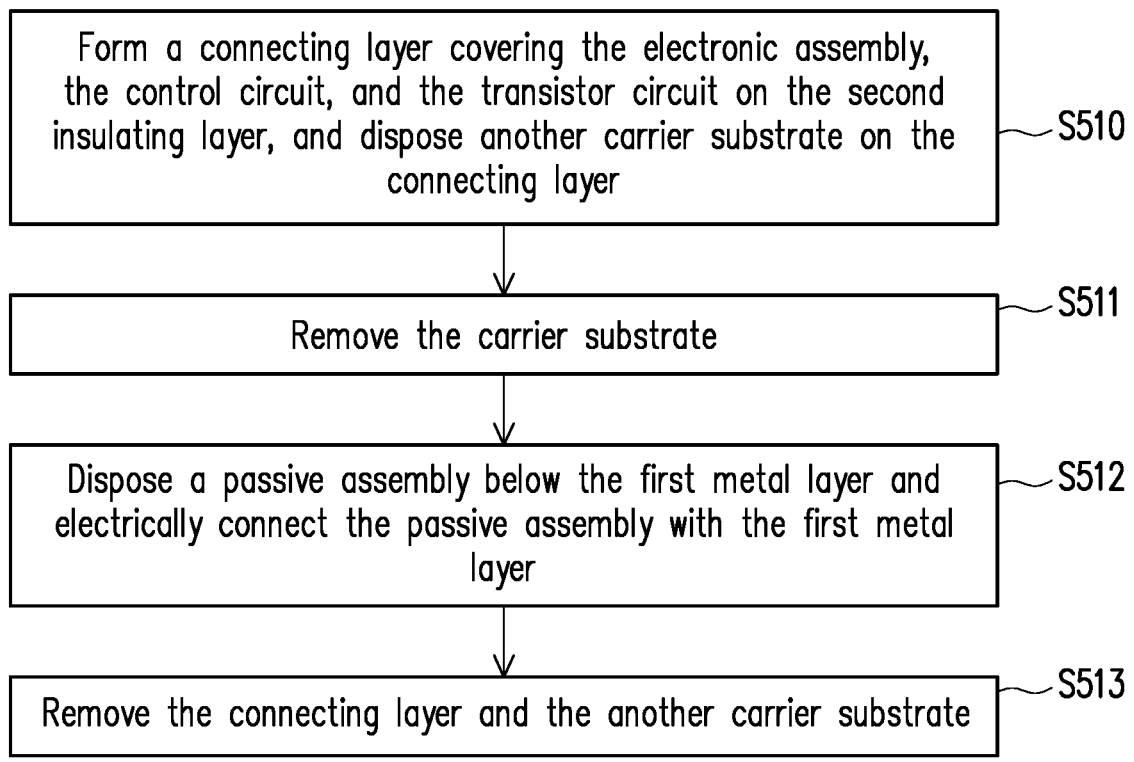
Figure 6A:
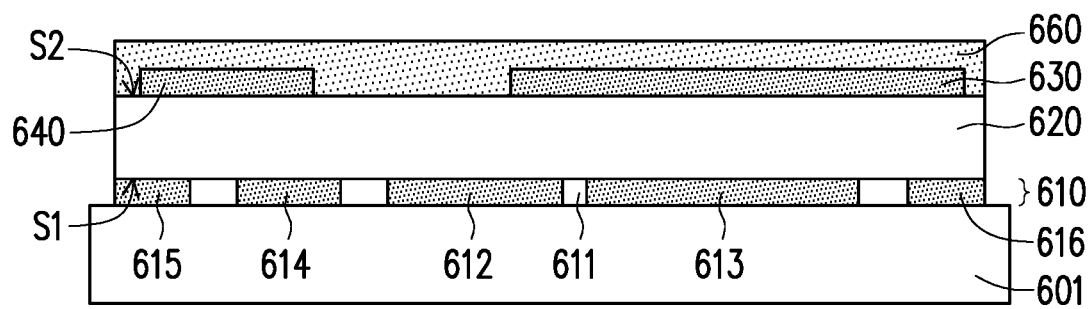
FIGS. 6A to 6D are schematic cross-sectional views illustrating structures in respective stages in the manufacturing method shown in FIGS. 5A and 5B.

FIGS. 5A and 5B are flowcharts illustrating a manufacturing method of the electronic apparatus according to the second embodiment of the disclosure. FIGS. 6A to 6D are schematic cross-sectional views illustrating structures in respective stages in the manufacturing method shown in FIGS. 5A and 5B. Each of the steps in the embodiment may be carried out by performing a corresponding semiconductor manufacturing process or a combination of a plurality of corresponding semiconductor manufacturing processes. In addition, the structures of FIGS. 3A to 3D formed in the respective intermediate steps may be respectively implemented independently as specific electronic apparatuses, and these structures are not limited to being only applicable to the electronic apparatus manufactured in the final step. Referring to FIGS. 5A and 6A, the manufacturing method of FIG. 5A allows to manufacture an electronic apparatus with a structure having double-sided RDL routing. In Step S501, a carrier substrate 601 is provided. The carrier substrate 601 may be a rigid substrate or a flexible substrate. The disclosure does not intend to impose a limitation on this regard. In Step S502, a first metal layer 610 having an opening 611 is formed on the carrier substrate 601. The opening 611 may be formed by performing a semiconductor etching process, for example. Also, in the first metal layer 610, a metal component or a circuit component such as an electrode 612, an electrode 613, an electrode 614, an electrode 615, and an electrode 616, etc., shown in FIG. 6A may be formed by performing a semiconductor etching process. However, the disclosure is not limited thereto. In some embodiments, one or more of the electrodes 613 to 616 may be omitted. In Step S503, a first insulating layer 620 may be formed on the first metal layer 610. As an example, the first surface S1 of the first insulating layer 620 directly or indirectly contacts the first metal layer 610. However, the disclosure is not limited thereto. In Step S504, a second metal layer 630 may be formed on the first insulating layer 620, and the second surface S2 of the first insulating layer 620 directly or indirectly contacts the second metal layer 630. The first surface S1 is opposite to the second surface S2. It should be noted that a projection of the opening 611 on the second surface S2 may be overlapped with a projection of the second metal layer 630 on the second surface S2. In Step S505, a routing layer 640 is formed on the first insulating layer 620. In addition, the routing layer 640 is electrically connected with the transistor circuit 650. In Step S506, a second insulating layer 660 covering the second metal layer 330 and the routing layer 630 is formed on the first insulating layer 620.

Figure 6B:
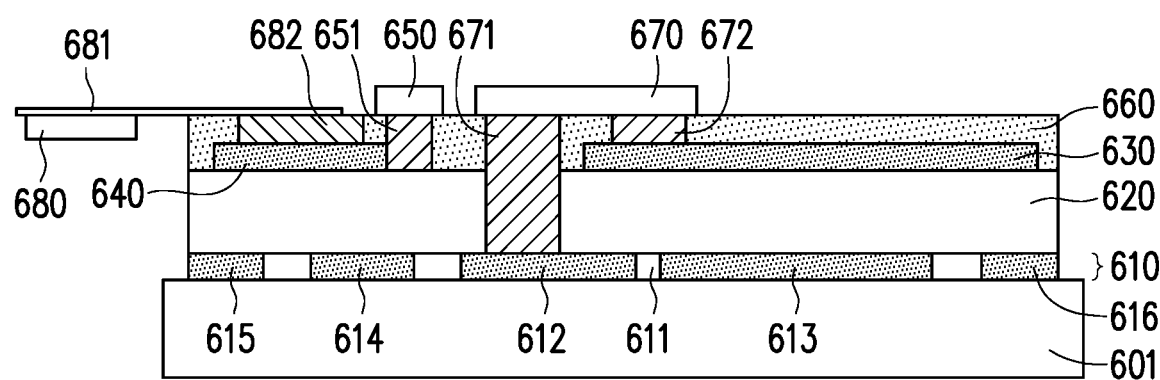

Referring to FIGS. 5A and 6B, in Step S507, the transistor circuit 650 is disposed on the second insulating layer 660 and electrically connected with the routing layer 640. The transistor circuit 650 may be electrically connected with the routing layer 640 via a conductor 651 by SMT. However, the disclosure is not limited thereto. The conductor 651 may be arranged as a via to penetrate through at least a portion of the second insulating layer 660. In Step S508, an electronic assembly 670 is disposed on the second insulating layer 660, and the electronic assembly 670 is electrically connected with the transistor circuit 650, the first metal layer 610, and the second metal layer 630. The electronic assembly 670 may be electrically connected with the first metal layer 610 and the second metal layer 630 through a conductor 671 and a conductor 672 by SMT, and electrically connected with the transistor circuit 650 via additional routing. However, the disclosure is not limited thereto. The conductor 671 may be arranged as a via to penetrate through at least a portion of the first insulating layer 620 and/or at least a portion of the second insulating layer 660. The conductor 672 may also be arranged as a via to penetrate through at least a portion of the second insulating layer 660. In Step S509, a control circuit 680 may be electrically connected with the routing layer 640. The control circuit 680, a conductive material 682, and the routing layer 640 are similar to the control circuit 180, the conductive material 182, and the routing layer 140. Therefore, details in this regard will not be repeated in the following. For example, the electronic assembly 670 is similar to the electronic assembly 170, so details in this regard will not be repeated in the following.

Figure 6C:
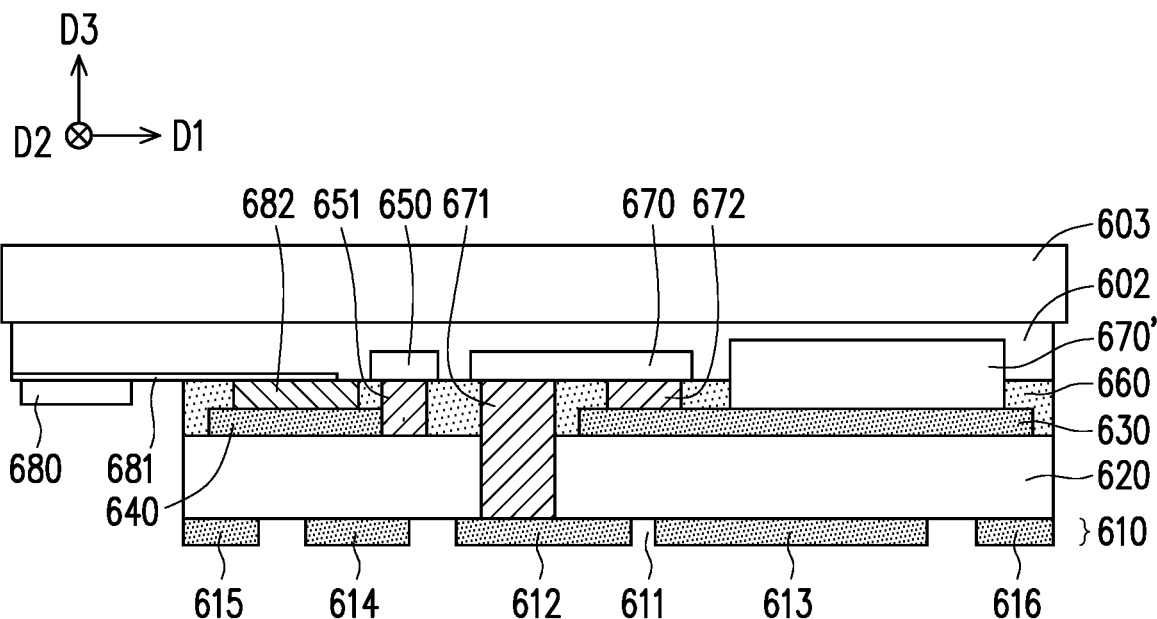
Figure 6D:
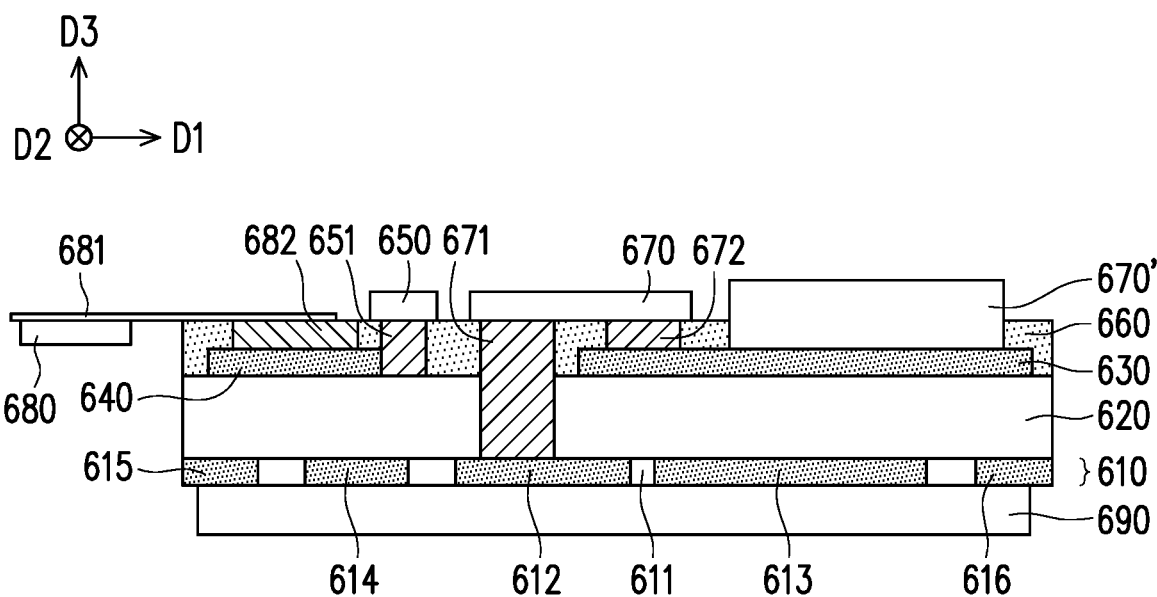

Referring to FIG. 6C, in some embodiments, Step S508 may further include further providing another electronic assembly 670' on the second insulating layer 660. In addition, the electronic assembly 670' is electrically connected with the second metal layer 630. Referring to FIGS. 5B and 6C, in Step S510, a connecting layer 602 covering the electronic assemblies 670 and 670', the transistor circuit 650, and the control circuit 680 is formed on the second insulating layer 660, and another carrier substrate 603 is disposed on the connecting layer 602. Step S510 is similar to Step S210, so details in this regard will not be repeated in the following.

Figure 7:
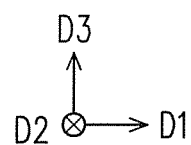
FIG. 7 is a schematic cross-sectional view illustrating a structure of an electronic apparatus according to a third embodiment of the disclosure.
Figure 7:
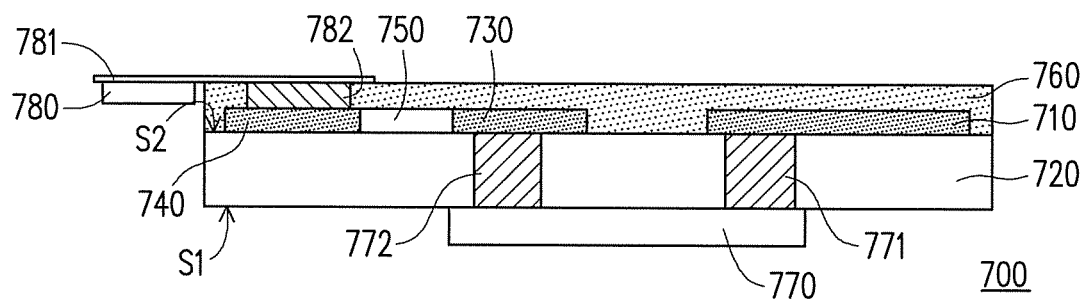

FIG. 7 is a schematic cross-sectional view illustrating a structure of an electronic apparatus according to a third embodiment of the disclosure. Referring to FIG. 7, an electronic apparatus 700 may include an electronic structure having single-sided redistribution layer (RDL) routing, so that a relevant electronic/circuit element may be disposed on one side of a substrate. Specifically, the electronic apparatus 700 may include a first metal layer 710, a first insulating layer 720, a second metal layer 730, a routing layer 740, a transistor circuit 750, a second insulating layer 760, a PN junction assembly 770, and a control circuit 780. The transistor circuit 750 may include one or more transistors, and the transistors may be bottom-gate transistors, top-gate transistors, or double/dual-gate transistors. In the embodiment, the first insulating layer 720 includes the first surface S1 and the second surface S2. The first surface S1 is opposite to the second surface S2. In the embodiment, the first insulating layer 720 may include a flexible circuit board material. However, the disclosure is not limited thereto. In some embodiments, the first insulating layer 720 may also include a rigid material, a flexible material, or a flexible circuit board, etc.

In the embodiment, the first metal layer 710 and the second metal layer 730 may be formed on the second surface S2 of the first insulating layer 720. It should be noted that the first metal layer 710 may include a circuit assembly or a metal assembly structure including at least one of an electrode, a bonding pad, a routing, and a heat sink, and the second metal layer 730 may also include a circuit assembly or a metal assembly structure including at least one of an electrode, a bonding pad, a routing, and a heat sink. In the embodiment, the routing layer 740 and the transistor circuit 750 may also be formed on the second surface S2 of the first insulating layer 720. The transistor circuit 750 may be electrically connected with the routing layer 740, and the routing layer 740 includes a plurality of circuit wires. In some embodiments, the first metal layer 710, the second metal layer 730, the routing layer 740, and the transistor circuit 750 may be formed at the same layer on the second surface S2 of the first insulating layer 720. In other embodiments, the first metal layer 710, the second metal layer 730, and the routing layer 740 may respectively keep different distances from the second surface S2 of the first insulating layer 720. However, the disclosure is not limited thereto.

In the embodiment, the second insulating layer 760 covering the first metal layer 710, the second metal layer 730, the routing layer 740, and the transistor circuit 750 is further formed on the second surface S2 of the first insulating layer 720. The PN junction assembly 770 is disposed on the first surface S1 of the first insulating layer 720, so as to be electrically connected with the first metal layer 710 and the second metal layer 730 via conductors 771 and 772. The conductors 771 and 772 may be arranged as vias to penetrate through the first insulating layer 720. In addition, the conductors 711 and 772 may include a metal conductive material, such as a tin lead alloy. In the embodiment, the PN junction assembly 770 may include a variable capacitor. In the embodiment, the control circuit 780 is disposed on a carrier plate 781 and electrically connected with the routing layer 740 through a conductive material 782, so as to be electrically connected with the transistor circuit 750 via the routing layer 740. In the embodiment, the control circuit 780 is configured to provide relevant electronic signals, such as control signals, driving signals, etc., to the PN junction assembly 770 via the transistor circuit 750 to control or drive the PN junction assembly 770. Therefore, the electronic apparatus 700 of the embodiment is provided with an architecture having the single-sided RDL routing and provided with the transistor circuit 750. In addition, the PN junction assembly 770 disposed on the substrate may be controlled or driven by the transistor circuit 750.

Figure 8:
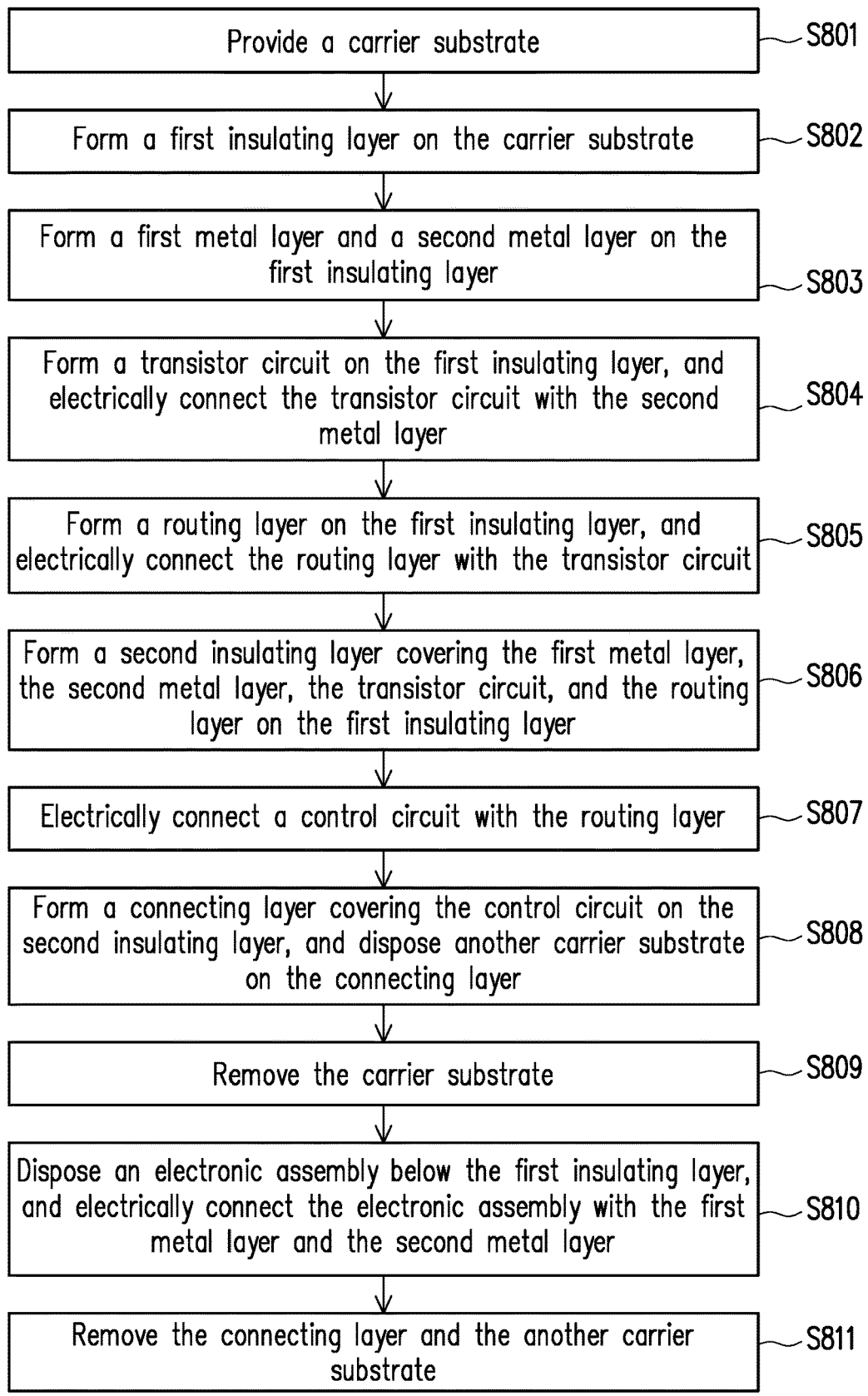
FIG. 8 is a flowchart illustrating a manufacturing method of the electronic apparatus according to the third embodiment of the disclosure.
Figure 9A:
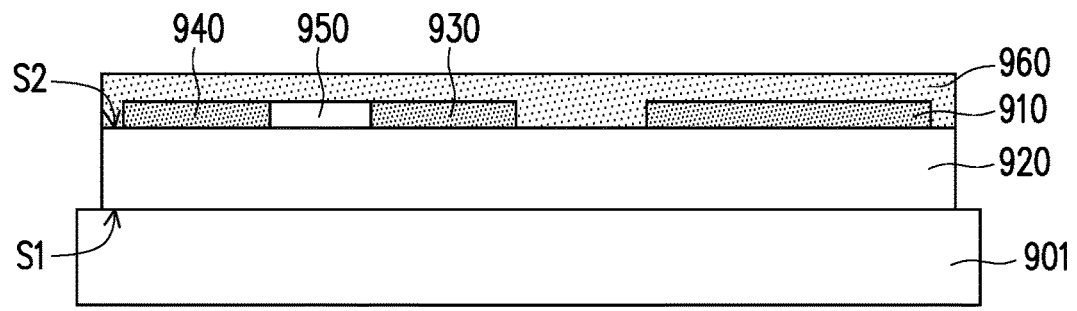
FIGS. 9A to 9D are schematic cross-sectional views illustrating structures in respective stages in the manufacturing method shown in FIG. 8.

FIG. 8 is a flowchart illustrating a manufacturing method of the electronic apparatus according to the third embodiment of the disclosure. FIGS. 9A to 9D are schematic cross-sectional views illustrating structures in respective stages in the manufacturing method shown in FIG. 8. Each of the steps in the embodiment may be carried out by performing a corresponding semiconductor manufacturing process or a combination of a plurality of corresponding semiconductor manufacturing processes. In addition, the structures of FIGS. 9A to 9D formed in the respective intermediate steps may be respectively implemented independently as specific electronic apparatuses, and these structures are not limited to being only applicable to the electronic apparatus manufactured in the final step. Referring to FIGS. 8 and 9A, the manufacturing method of FIG. 8 allows to manufacture an electronic apparatus with an electronic structure having single-sided RDL routing. In Step S801, a carrier substrate 901 is provided. The material of the carrier substrate 901 may, for example, include the materials for a rigid substrate or a flexible substrate. The disclosure does not intend to impose a limitation on this regard. In Step S802, a first insulating layer 920 is formed on the carrier substrate 901. In Step S803, a first metal layer 910 and a second metal layer 930 may be formed on the first insulating layer 920. The first metal layer 910 and the second metal layer 930 may be, for example, a metal component or a circuit component, such as a bonding pad, a heat sink, a routing, an electrode sheet, that is formed by performing a semiconductor etching process. However, the disclosure is not limited thereto. In Step S804, a transistor circuit 950 is formed on the first insulating layer 920, and the transistor circuit 950 may be electrically connected with the second metal layer 930. In Step S805, a routing layer 940 is formed on the first insulating layer 920. In addition, the routing layer 940 is electrically connected with the transistor circuit 950. In Step S806, a second insulating layer 960 covering the first metal layer 910, the second metal layer 930, the routing layer 940, and the transistor circuit 950 is formed on the first insulating layer 920.

Figure 9B:
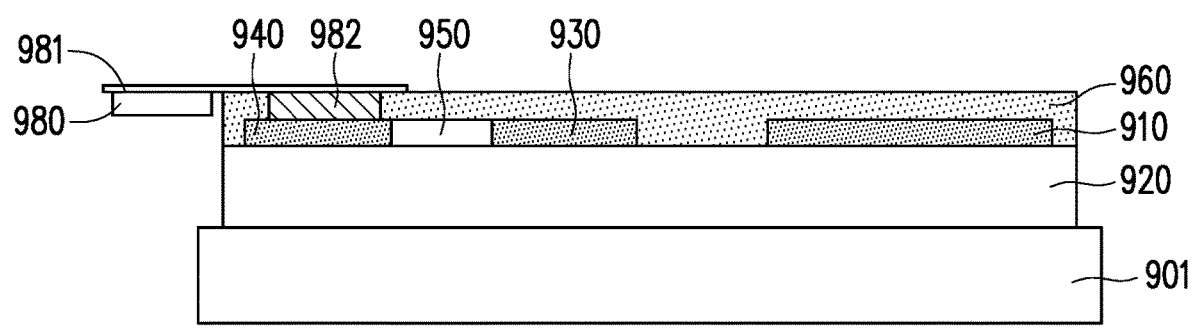

Referring to FIGS. 8 and 9B, in Step S807, a control circuit 980 is electrically connected with the routing layer 940. The control circuit 980 may be manufactured on a carrier plate 981 by COF or COG. The material of the carrier plate 981 may include a thin film, glass, or other suitable materials. The routing layer 940 may include a fan-out routing, and the routing layer 940 may be arranged in correspondence with the via or opening of the second insulating layer 960 above the routing layer 940. In the embodiment, a control chip formed by the control circuit 980 and the carrier plate 981 may be arranged above the routing layer 940 in a chip face down manner, and the control chip may be electrically connected with the routing layer 940 by SMT or by bonding with an anisotropic conductive film (ACF). However, the disclosure is not limited thereto. For example, the control circuit 980 may be electrically connected with the routing layer 940 through a conductive material 982 and electrically connected with the transistor circuit 950 through the routing layer 940.

Figure 9C:
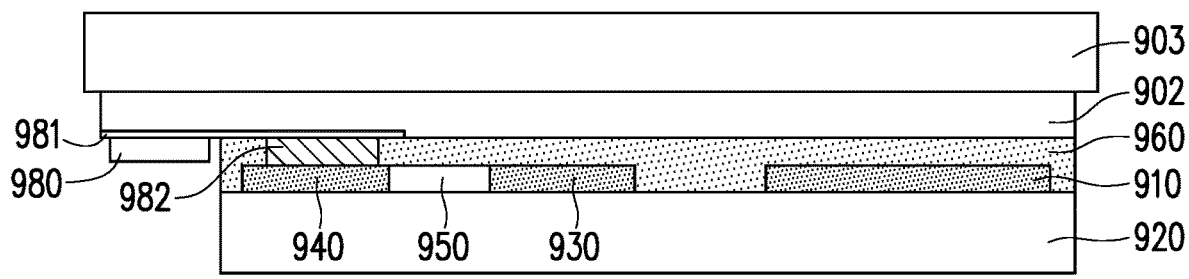
Figure 9D:
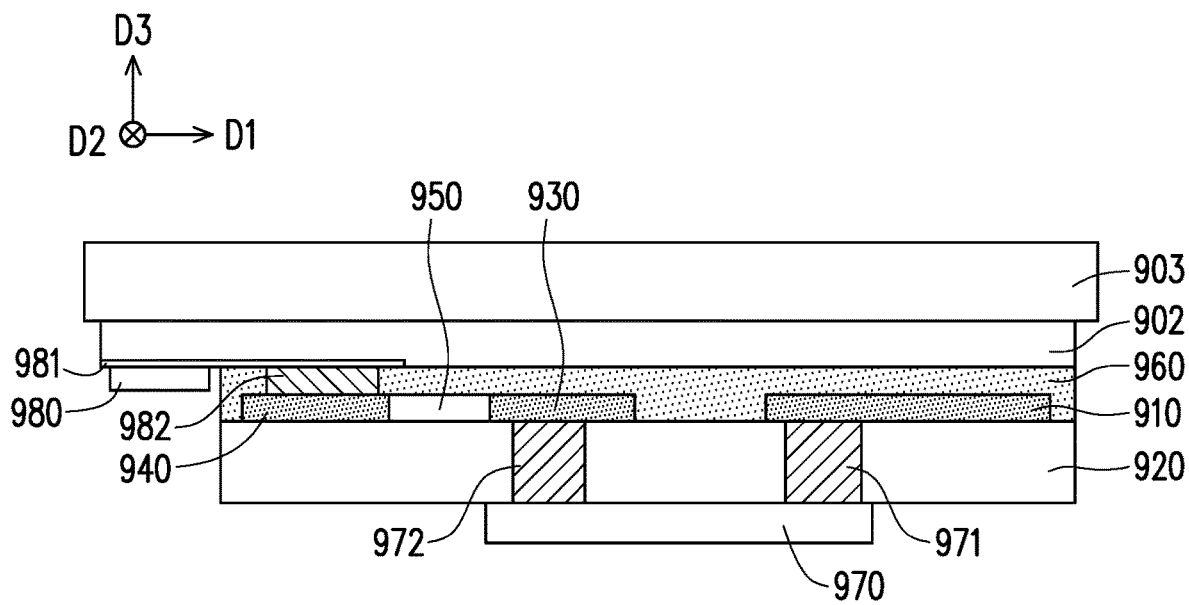

Referring to FIGS. 8 and 9C, in Step S808, a connecting layer 902 covering the control circuit 980 is formed on the second insulating layer 960, and another carrier substrate 903 is formed on the connecting layer 902. The carrier substrate 903 may be a rigid substrate, a flexible substrate, or a combination thereof. In addition, the connecting layer 902 may include a temporary connecting material, for example. In Step S809, the carrier substrate 901 is removed. The carrier substrate 901 may be removed by, for example, laser, heating, or light irradiation, etc. The disclosure does not intend to impose a limitation on this regard. Since the first insulating layer 920 may include the flexible material, for example, in order to reduce the damages to the structures and the assembly on the sides of the first insulating layer 920 when the carrier substrate 901 is removed, the another carrier substrate 903 and the connecting layer 902 may be firstly formed on the second insulating layer 960 and then the carrier substrate 901 be removed. However, the disclosure is not limited thereto. In Step S810, an electronic assembly 970 is disposed below the first insulating layer 920 (on the first surface S1), and the electronic assembly 970 is electrically connected with the first metal layer 910 and the second metal layer 930. The electronic assembly 970 may be electrically connected with the first metal layer 910 and the second metal layer 930 via a conductor 971 and a conductor 972 and be electrically connected with the transistor circuit 950. The conductors 971 and 972 may be arranged as vias to penetrate through at least a portion of the first insulating layer 920. In Step S811, the connecting layer 902 and the another carrier substrate 903 are removed. The connecting layer 902 may be removed by, for example, laser, heating, or light irradiation, etc., so that the carrier substrate 903 is separated from the second insulating layer 960.

Figure 10:
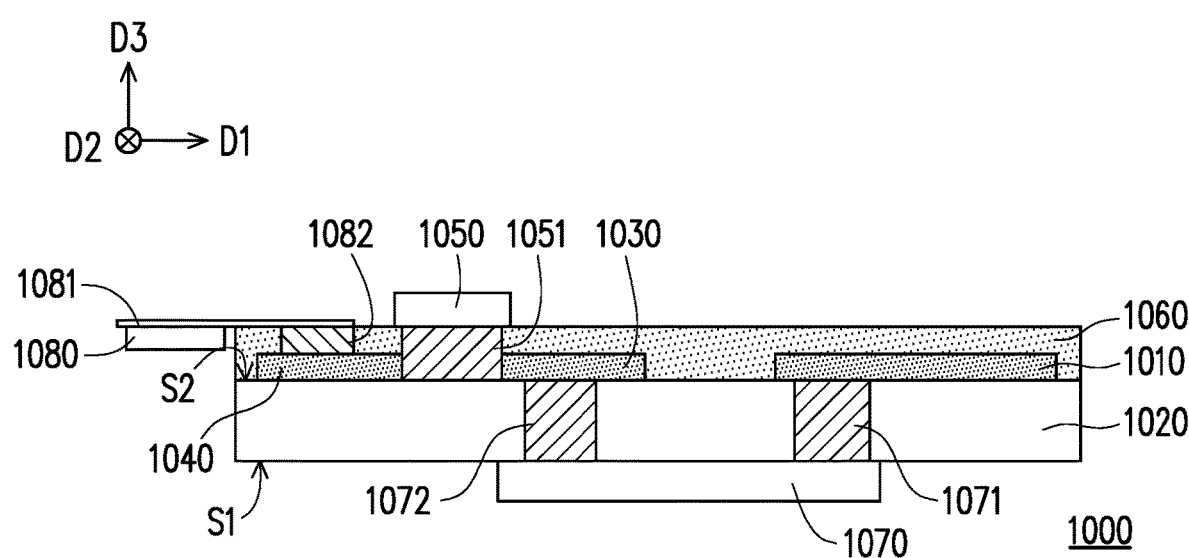
FIG. 10 is a schematic cross-sectional view illustrating a structure of an electronic apparatus according to a fourth embodiment of the disclosure.

FIG. 10 is a schematic cross-sectional view illustrating a structure of an electronic apparatus according to a fourth embodiment of the disclosure. Referring to FIG. 10, an electronic apparatus 1000 may include an electronic structure having single-sided redistribution layer (RDL) routing, so that a relevant electronic/circuit element may be disposed on one side of a first insulating layer 1020. Specifically, the electronic apparatus 1000 includes a first metal layer 1010, a first insulating layer 1020, a second metal layer 1030, a routing layer 1040, a transistor circuit 1050, a second insulating layer 1060, an electronic assembly 1070 (e.g., a PN junction assembly), and a control circuit 1080. The transistor circuit 1050 may include one or more transistors, and the transistors may be bottom-gate transistors, top-gate transistors, or double/dual-gate transistors. In the embodiment, the first insulating layer 1020 includes the first surface S1 and the second surface S2. The first surface S1 is opposite to the second surface S2. In the embodiment, the first insulating layer 1020 may include a flexible material. However, the disclosure is not limited thereto. In some embodiments, the first insulating layer 1020 may also include a rigid material, a flexible material, or a flexible circuit board, etc. It should be noted that the transistor circuit 1050 of the embodiment may include a base material (not shown) and at least one transistor, and the at least one transistor is disposed on the base material. The at least one transistor may be electrically connected with the electronic assembly 1070 and/or the second metal layer 1030.

In the embodiment, the first metal layer 1010 and the second metal layer 1030 may be formed on the second surface S2 of the first insulating layer 1020. It should be noted that the first metal layer 1010 may include a circuit assembly or a metal assembly structure including at least one of an electrode, a bonding pad, a routing, and a heat sink, and the second metal layer 1030 may also include a circuit assembly or a metal assembly structure including at least one of an electrode, a bonding pad, a routing, and a heat sink. However, the disclosure is not limited thereto. In the embodiment, the routing layer 1040 may be further formed on the second surface S2 of the first insulating layer 1020. In some embodiments, the first metal layer 1010, the second metal layer 1030 and the routing layer 1040 may be formed at the same layer on the second surface S2 of the first insulating layer 1020. In other embodiments, the first metal layer 1010, the second metal layer 1030, and the routing layer 1040 may respectively keep different distances from the second surface S2 of the first insulating layer 1020.

In the embodiment, the second insulating layer 1060 covering the first metal layer 1010, the second metal layer 1030 and the routing layer 1040 is further formed on the second surface S2 of the first insulating layer 1020. The transistor circuit 1050 is disposed on the second insulating layer 1060, and the transistor circuit 1050 may be electrically connected with the routing layer 1040 via a conductor 1051. The conductor 1051 may be arranged as a via to penetrate through the second insulating layer 1060. The electronic assembly 1070 (e.g., a PN junction assembly) is disposed on the first surface S1 of the first insulating layer 1020. The conductors 1071 and 1072 may be arranged as vias to penetrate through the first insulating layer 1020. In addition, the conductors 1071 and 1072 may include a metal conductive material, such as a tin lead alloy. In the embodiment, the control circuit 1080 is disposed on a carrier plate 1081 and may be electrically connected with the routing layer 1040 through a conductive material 1082, so as to be electrically connected with the transistor circuit 1050 via the routing layer 1040.

Figure 11:
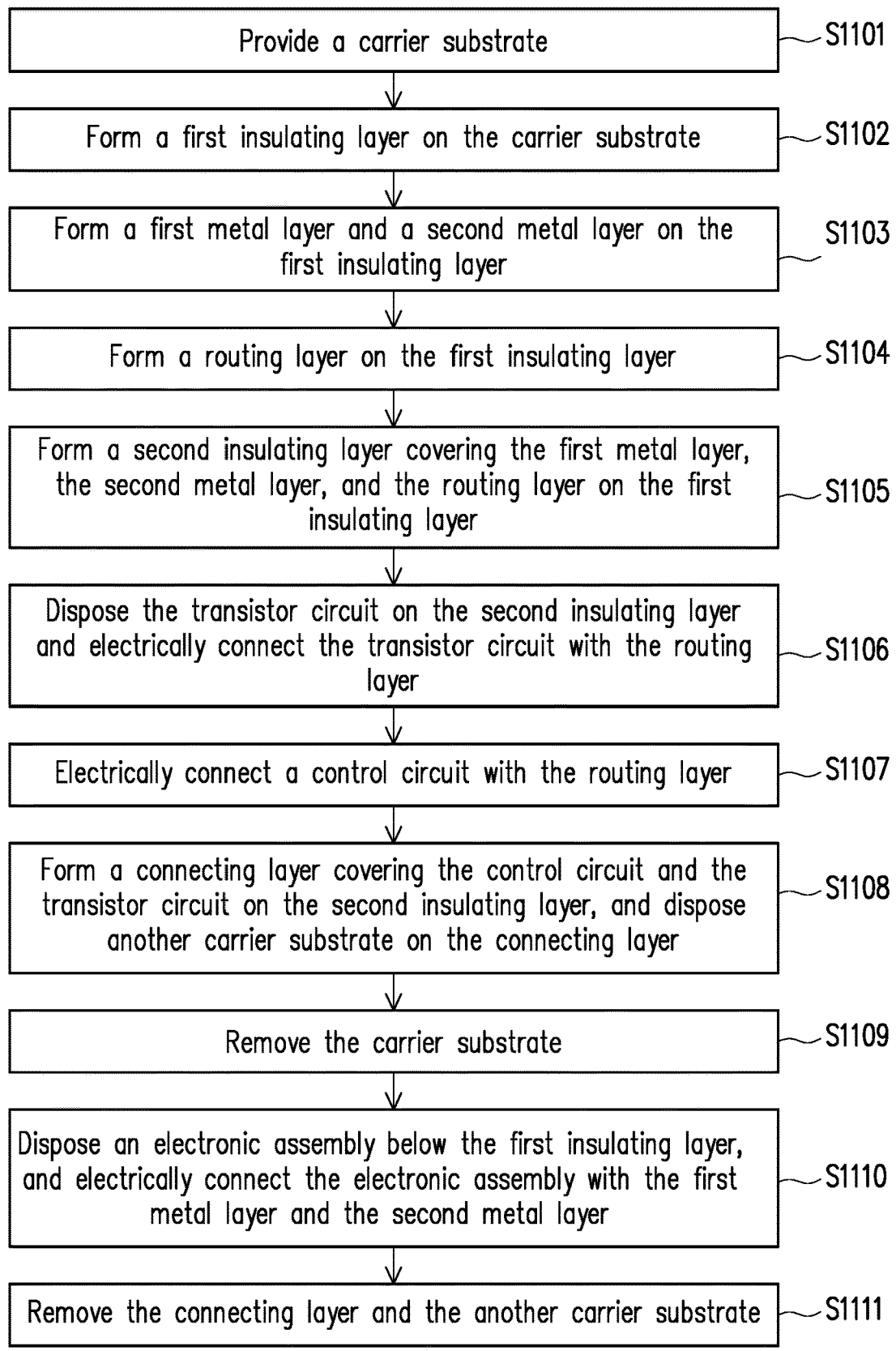
FIG. 11 is a flowchart illustrating a manufacturing method of the electronic apparatus according to the fourth embodiment of the disclosure.
Figure 12A:
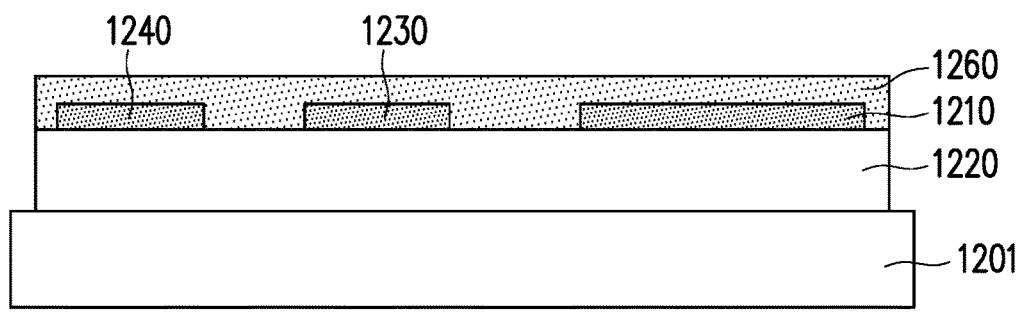
FIGS. 12A to 12D are schematic cross-sectional views illustrating structures in respective stages in the manufacturing method shown in FIG. 11.

FIG. 11 is a flowchart illustrating a manufacturing method of the electronic apparatus according to the fourth embodiment of the disclosure. FIGS. 12A to 12D are schematic cross-sectional views illustrating structures in respective stages in the manufacturing method shown in FIG. 11. Each of the steps in the embodiment may be carried out by performing a corresponding semiconductor manufacturing process or a combination of a plurality of corresponding semiconductor manufacturing processes. In addition, the structures of FIGS. 12A to 12D formed in the respective intermediate steps may be respectively implemented independently as specific electronic apparatuses, and these structures are not limited to being only applicable to the electronic apparatus manufactured in the final step. Referring to FIGS. 11 and 12A, the manufacturing method of FIG. 11 allows to manufacture an electronic apparatus with an electronic structure having single-sided RDL routing. In Step S1101, a carrier substrate 1201 is provided. The carrier substrate 1201 may be a rigid substrate or a flexible substrate. The disclosure does not intend to impose a limitation on this regard. In Step S1102, a first insulating layer 1220 is formed on the carrier substrate 1201. In Step S1103, a first metal layer 1210 and a second metal layer 1230 may be formed on the first insulating layer 1220. In Step S1104, a routing layer 1240 is formed on the first insulating layer 1220. In addition, the routing layer 1240 is electrically connected with the transistor circuit 1250. In Step S1105, a second insulating layer 1260 covering the first metal layer 1210, the second metal layer 1230, and the routing layer 1240 is formed on the first insulating layer 1220.

Figure 12B:
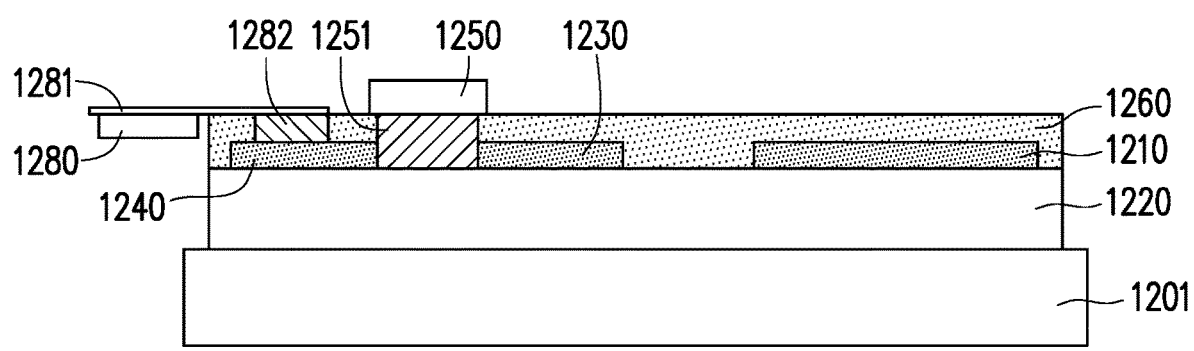
Figure 12C:
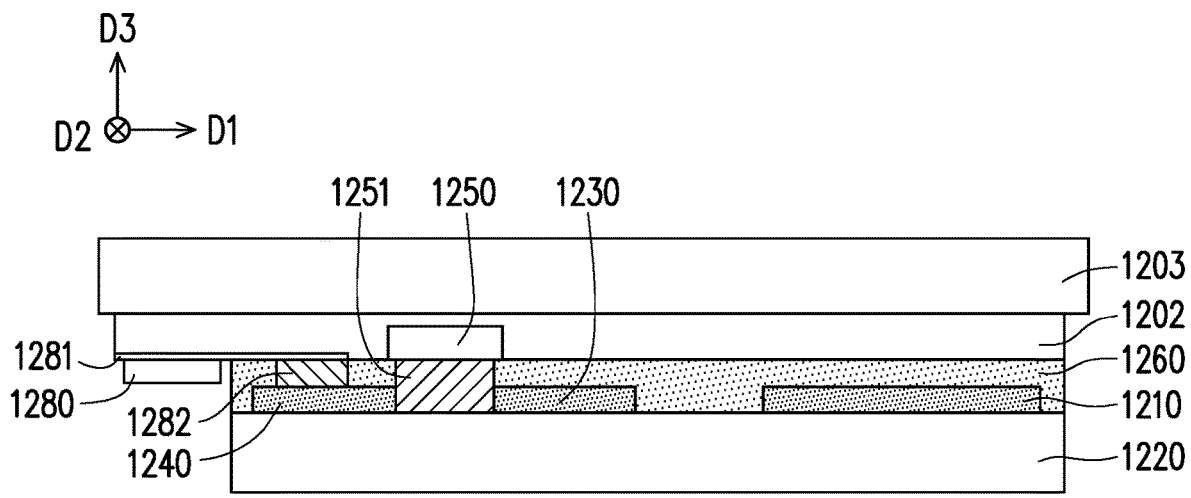
Figure 12D:
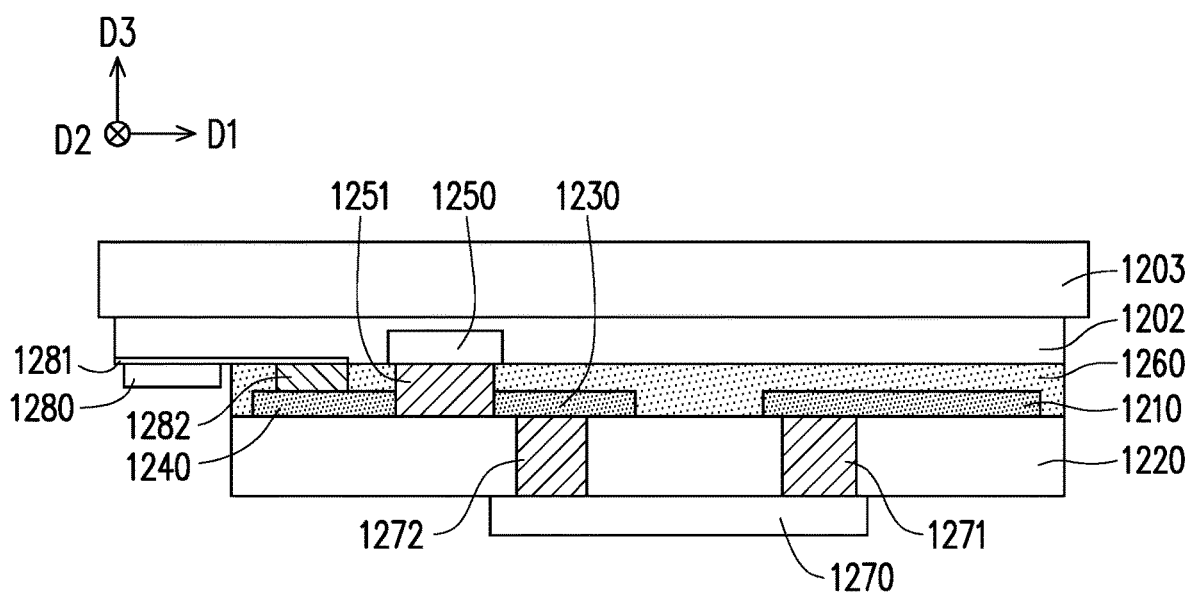

Referring to FIGS. 11 and 12B, in Step S1106, the transistor circuit 1250 is disposed on the second insulating layer 1260 and electrically connected with the routing layer 1240. The transistor circuit 1250 may be electrically connected with the routing layer 1240 via a conductor 1251. In Step S1107, a control circuit 1280 is electrically connected with the routing layer 1240. Referring to FIGS. 11 and 12C, in Step S1108, a connecting layer 1202 covering the control circuit 1280 and the transistor circuit 1250 is formed on the second insulating layer 1260, and another carrier substrate 1203 is formed on the connecting layer 1202. In Step S1109, the carrier substrate 1201 is removed. In Step S1110, an electronic assembly 1270 (e.g., a PC junction assembly with variable capacitor) is disposed below the first insulating layer 1220 (on the first surface S1), and the electronic assembly 1270 is electrically connected with the first metal layer 1210 and the second metal layer 1230. In Step S1111, the connecting layer 1202 and the another carrier substrate 1203 are removed. The connecting layer 1202 may be removed by, for example, laser, heating, or light irradiation, etc., so that the carrier substrate 1203 is separated from the second insulating layer 1260.

Figure 13:
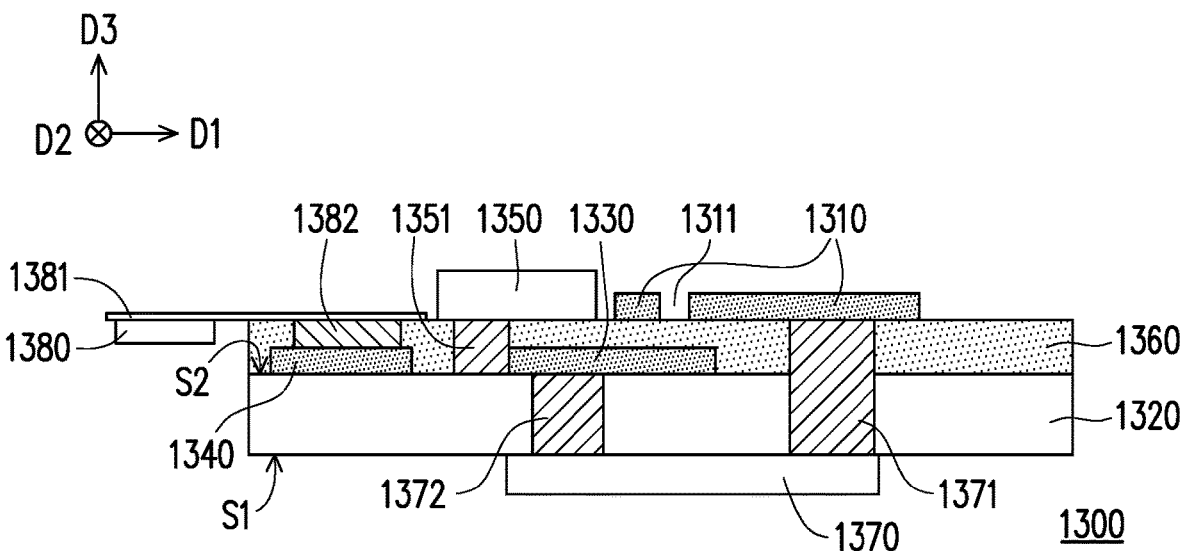
FIG. 13 is a schematic cross-sectional view illustrating a structure of an electronic apparatus according to a fifth embodiment of the disclosure.

FIG. 13 is a schematic cross-sectional view illustrating a structure of an electronic apparatus according to a fifth embodiment of the disclosure. Referring to FIG. 13, an electronic apparatus 1300 may include an electronic structure having single-sided redistribution layer (RDL) routing, so that a relevant electronic/circuit element may be disposed on one side of a first insulating layer 1320. Specifically, the electronic apparatus 1300 includes a first metal layer 1310, a first insulating layer 1320, a second metal layer 1330, a routing layer 1340, a transistor circuit 1350, a second insulating layer 1360, an electronic assembly 1370 (e.g., a PN junction assembly), and a control circuit 1380.

Specifically, the second metal layer 1330 and the routing layer 1340 are formed on the second surface S2 of the first insulating layer 1320. In some embodiments, the second metal layer 1330 and the routing layer 1340 may be formed at the same layer or different layers on the second surface S2 of the first insulating layer 1320. In the embodiment, the second insulating layer 1360 covering the second metal layer 1330 and the routing layer 1340 is formed on the second surface S2 of the first insulating layer 1320. In addition, the first metal layer 1310 having an opening 1311 is formed on the second insulating layer 1360. It should be noted that a projection of the opening 1311 on the second surface S2 may be overlapped with a projection of the second metal layer 1330 on the second surface S2. In the embodiment, the transistor circuit 1350 may be electrically connected with a conductor 1351 and the second metal layer 1330. In the embodiment, the electronic assembly 1370 is disposed on the first surface S1 of the first insulating layer 1320, and may also be electrically connected with the first metal layer 1310 and the second metal layer 1330 via conductors 1371 and 1372.

In the embodiment, the control circuit 1380 is configured to provide relevant electronic signals, such as control signals, driving signals, etc., to the electronic assembly 1370 via the transistor circuit 1350 to control or drive the electronic assembly 1370. For example, the electronic assembly 1370 may include a PN junction assembly. In addition, the control circuit 1380 may modulate the capacitance value through the transistor circuit 1350, so that the capacitance value between the first metal layer 1310 and the second metal layer 1330 may be correspondingly adjusted. An electromagnetic wave radiation assembly or an electromagnetic wave radiation modulator may be formed between the opening 1311 of the first metal layer 1310 and the second metal layer 1330.

Figure 14:
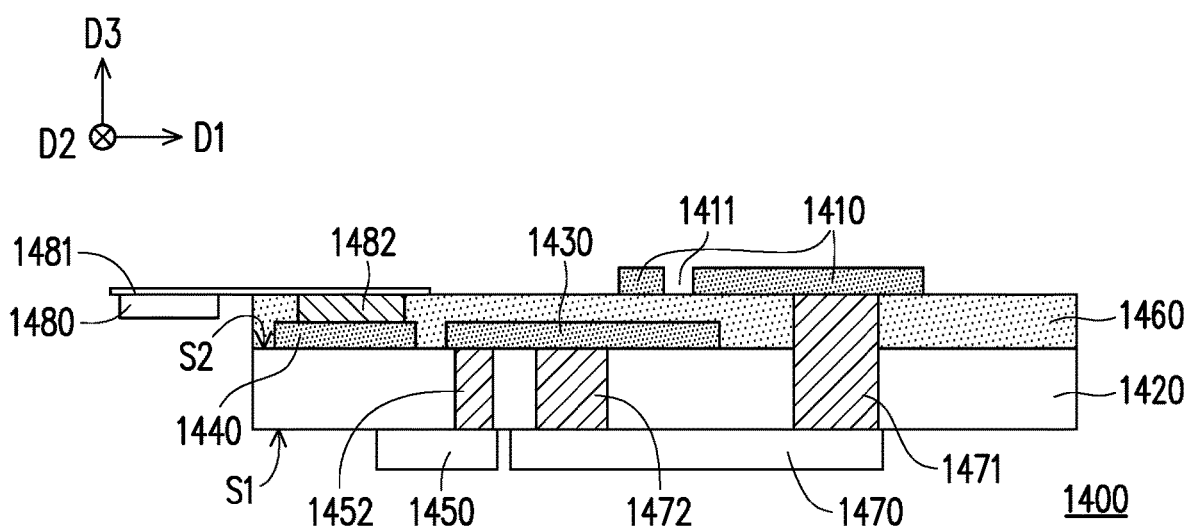
FIG. 14 is a schematic cross-sectional view illustrating a structure of an electronic apparatus according to a sixth embodiment of the disclosure.

FIG. 14 is a schematic cross-sectional view illustrating a structure of an electronic apparatus according to a sixth embodiment of the disclosure. Referring to FIG. 14, an electronic apparatus 1400 may be an electronic structure having single-sided redistribution layer (RDL) routing, so that a relevant electronic/circuit element may be disposed on one side of a first insulating layer 1420. Specifically, the electronic apparatus 1400 includes a first metal layer 1410, a first insulating layer 1420, a second metal layer 1430, a routing layer 1440, a transistor circuit 1450, a second insulating layer 1460, an electronic assembly 1470, and a control circuit 1480.

In the embodiment, the transistor circuit 1450 may be electrically connected with a conductor 1452 and the second metal layer 1430. The conductor 1452 may be arranged as a via to penetrate through at least a portion of the first insulating layer 1420. In the embodiment, the control circuit 1480 is configured to provide relevant electronic signals, such as control signals, driving signals, etc., to the electronic assembly 1470 via the transistor circuit 1450 to control or drive the electronic assembly 1470. In an embodiment, the control circuit 1480 is electrically connected with the electronic assembly 1470 via the second metal layer 1430, the transistor circuit 1450, and/or the routing layer 1440.

Figure 15:
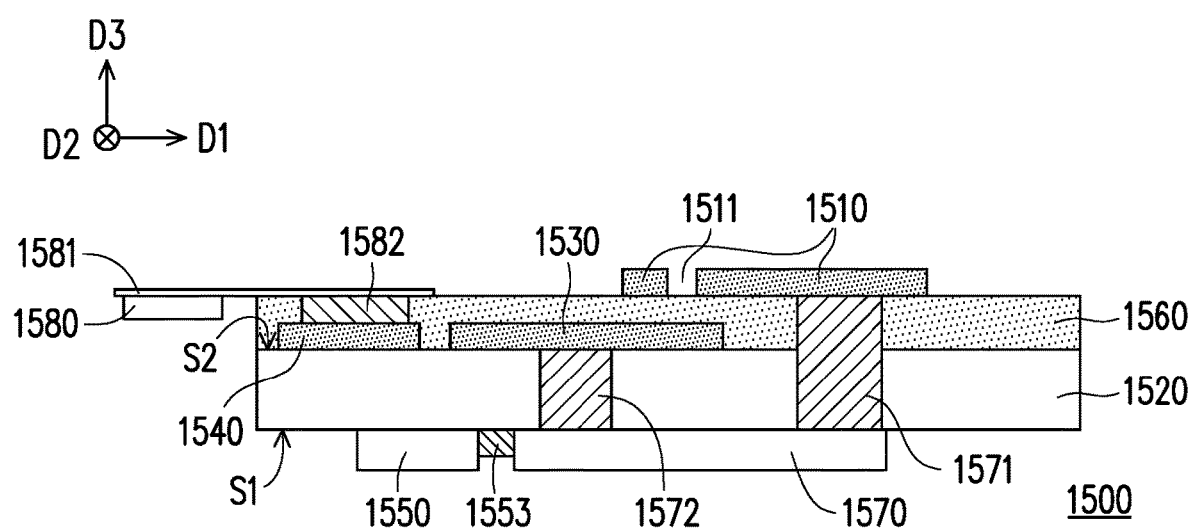
FIG. 15 is a schematic cross-sectional view illustrating a structure of an electronic apparatus according to a seventh embodiment of the disclosure.

FIG. 15 is a schematic cross-sectional view illustrating a structure of an electronic apparatus according to a seventh embodiment of the disclosure. Referring to FIG. 15, an electronic apparatus 1500 may include an electronic structure having single-sided redistribution layer (RDL) routing.

Specifically, the electronic apparatus 1500 may include a first metal layer 1510, a first insulating layer 1520, a second metal layer 1530, a routing layer 1540, a transistor circuit 1550, a second insulating layer 1560, an electronic assembly 1570, and a control circuit 1580.

In the embodiment, the transistor circuit 1550 may be formed on the first surface S1 of the first insulating layer 1520, and may be electrically connected with the PN junction assembly 1570 via the conductor 1553. The conductor 1553 is formed on the first surface S of the first insulating layer 1520 and connects the transistor circuit 1550 and the PN junction assembly 1570. In addition, the conductor 1553 may include a metal conductive material. In an embodiment, the control circuit 1580 may be electrically connected with the electronic assembly 1570 via the second metal layer 1530, the transistor circuit 1550, and/or the routing layer 1540. However, the disclosure is not limited thereto.

In view of the foregoing, the electronic apparatus and the manufacturing method thereof according to the embodiments of the disclosure are able to provide an electronic structure having single/double-sided RDL routing and provided with the transistor circuit, and the electronic assembly disposed on the substrate may be controlled or driven by the transistor circuit. In addition, the single/double-sided RDL routing architecture according to the embodiments of the disclosure can be realized with an architecture having a fewer number of layers. Accordingly, the size of the electronic apparatus and the manufacturing cost can be effectively reduced.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A manufacturing method of an electronic apparatus, comprising:
   providing a carrier substrate;
   forming a first insulating layer on the carrier substrate, and a first surface of the first insulating layer contacts the carrier substrate;
   forming a first metal layer and a second metal layer on the first insulating layer, and a second surface of the first insulating layer contacts the first metal layer and the second metal layer, wherein the first surface is opposite to the second surface;
   electrically connecting a transistor circuit with the second metal layer;
   removing the carrier substrate; and
   disposing a PN junction assembly having a variable capacitor on the first insulating layer, and electrically connecting the PN junction assembly with the first metal layer and the second metal layer.

2. The manufacturing method as claimed in claim 1, wherein before removing the carrier substrate, the manufacturing method further comprises:
   forming the transistor circuit on the first insulating layer;
   forming a routing layer on the first insulating layer, and electrically connecting the routing layer with the transistor circuit;
   forming a second insulating layer covering the first metal layer, the second metal layer, the transistor circuit, and the routing layer on the first insulating layer; and
   electrically connecting a control circuit with the routing layer.

3. The manufacturing method as claimed in claim 2, wherein before removing the carrier substrate, the manufacturing method further comprises:
   forming a connecting layer covering the control circuit on the second insulating layer, and disposing another carrier substrate on the connecting layer.

4. The manufacturing method as claimed in claim 1, wherein before removing the carrier substrate, the manufacturing method further comprises:
   forming a routing layer on the first insulating layer;
   forming a second insulating layer covering the first metal layer, the second metal layer, and the routing layer on the first insulating layer;
   disposing the transistor circuit on the second insulating layer and electrically connecting the transistor circuit with the routing layer; and
   electrically connecting a control circuit with the routing layer.

5. The manufacturing method as claimed in claim 4, wherein before removing the carrier substrate, the manufacturing method further comprises:
   forming a connecting layer covering the control circuit and the transistor circuit on the second insulating layer, and disposing another carrier substrate on the connecting layer.

6. The manufacturing method as claimed in claim 1, wherein the first metal layer has an opening, the first metal layer is formed above the second metal layer, and a projection of the opening on the second surface is overlapped with a projection of the second metal layer on the second surface.

* * * * *